United States Patent [19]
Takashima et al.

[11] Patent Number: 5,903,022
[45] Date of Patent: May 11, 1999

[54] SEMICONDUCTOR MEMORY DEVICE HAVING IMPROVED WORD LINE ARRANGEMENT IN A MEMORY CELL ARRAY

[75] Inventors: Daisaburo Takashima, Yokohama; Shinichiro Shiratake, Tokyo; Tsuneo Inaba, Ichikawa, all of Japan

[73] Assignee: Kabushiki Kaisha Toshiba, Kawasaki, Japan

[21] Appl. No.: 08/630,461

[22] Filed: Apr. 10, 1996

[30] Foreign Application Priority Data

Apr. 12, 1995 [JP] Japan ..................................... 7-087211
May 2, 1995 [JP] Japan ..................................... 7-108691

[51] Int. Cl.⁶ ................................................. H01L 27/108
[52] U.S. Cl. ............................... 257/296; 365/51; 365/63; 365/72
[58] Field of Search ..................................... 257/210, 211, 257/390; 365/185.06, 185.11, 185.13, 63, 51, 72

[56] References Cited

U.S. PATENT DOCUMENTS

| | | | |
|---|---|---|---|
| 4,709,351 | 11/1987 | Kajigaya | 257/390 |
| 4,912,677 | 3/1990 | Itano et al. | 365/185.06 |
| 5,274,597 | 12/1993 | Ohbayashi et al. | 365/204 |
| 5,313,432 | 5/1994 | Lin et al. | 365/185.06 |
| 5,319,605 | 6/1994 | Min et al. | 365/230.06 |

FOREIGN PATENT DOCUMENTS

60-22337 2/1985 Japan .
60-247943 12/1985 Japan .

OTHER PUBLICATIONS

Masayuki Nakamura, et al., "A 29ns 64Mb DRAM with Hierarchical Array Architecture", 1995 IEEE International Solid–State Circuits Conference Digest of Technical Papers, (pp. 246–247), Feb. 1995.

K. Noda, et al., "A Boosted Dual Word–line Decoding Scheme for 256Mb DRAMs", 1992 Symposium on VLSI Circuits Digest of Technical Papers, (pp. 112–113), 1992.

Tadahiko Sugibayashi, et al., "A 30ns 256Mb DRAM with Multi–Divided Array Structure", 1993 IEEE International Solid–State Circuits Conference, (pp. 50–51), 1993.

Primary Examiner—Sara Crane
Attorney, Agent, or Firm—Oblon, Spivak, McClelland, Maier & Neustadt, P.C.

[57] ABSTRACT

A semiconductor memory device according to the present invention comprises a plurality of word lines constituted by gate wirings, a memory cell array having memory cells selectively arranged at nodes between the plurality of word lines and a plurality of bit lines, the memory cell array having a plurality of subarrays which are divided in a word line arrangement direction, a main row decoder arranged at least one end of the memory cell array in the word line arrangement direction, a plurality of sub-row decoders arranged at least one end of each of the plurality of subarrays, and a first wiring layer formed on a layer above the gate wirings and extending from the sub-row decoder, and the first wiring layer is wired to a position where the subarray is divided by two in the word line arrangement direction to be brought into contact with the gate wiring.

33 Claims, 24 Drawing Sheets

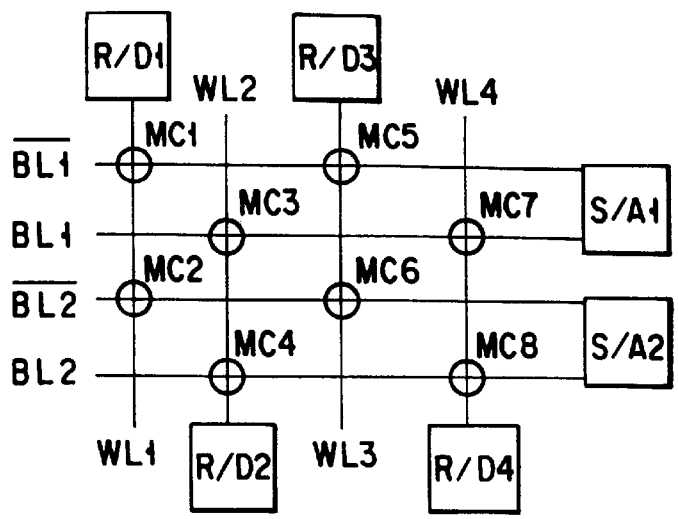
FIG. 1A
(PRIOR ART)
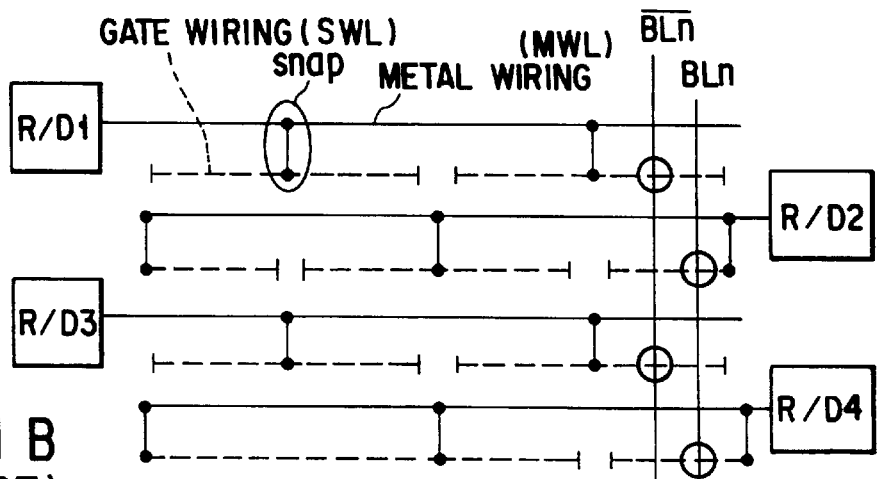
FIG. 1B
(PRIOR ART)
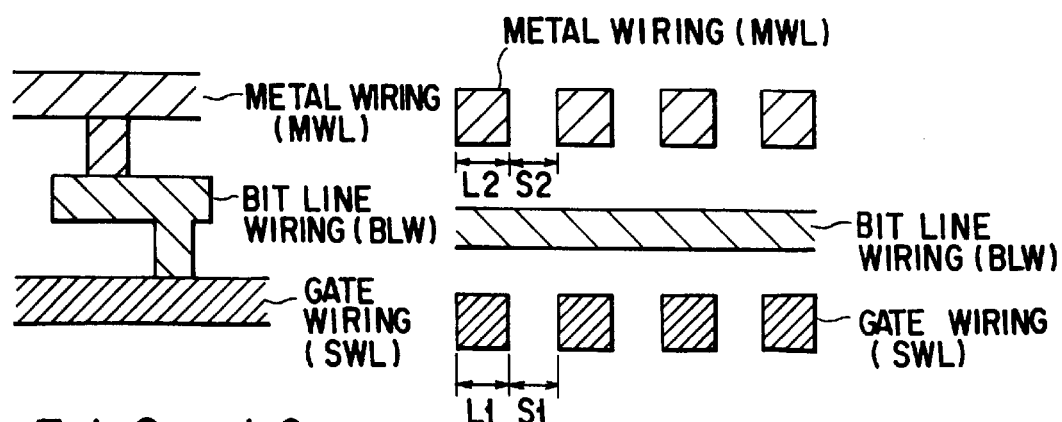
FIG. 1C
(PRIOR ART)
FIG. 1D
(PRIOR ART)

$$L4 + S4 = \frac{4}{3}(L1 + S1)$$

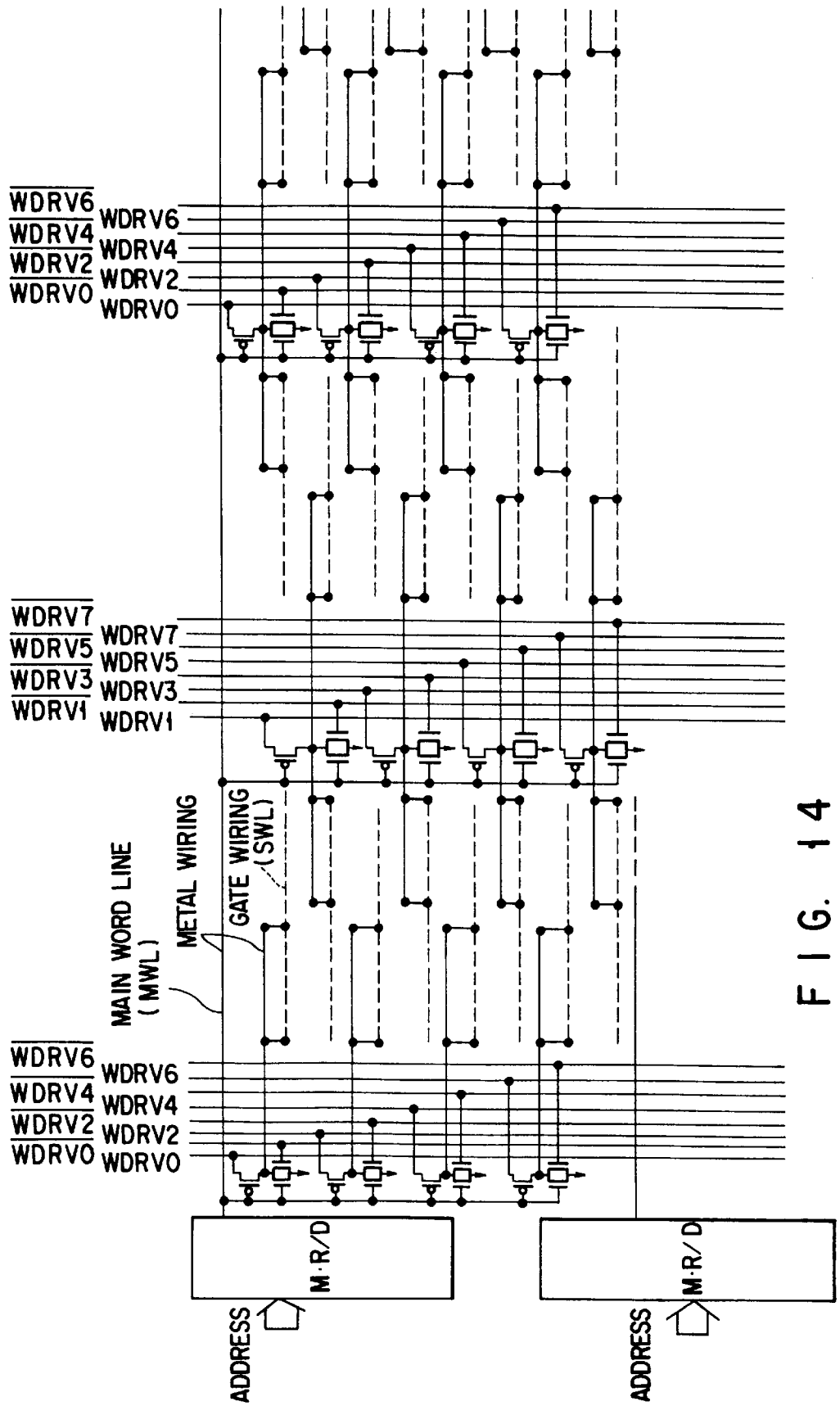
F I G. 14

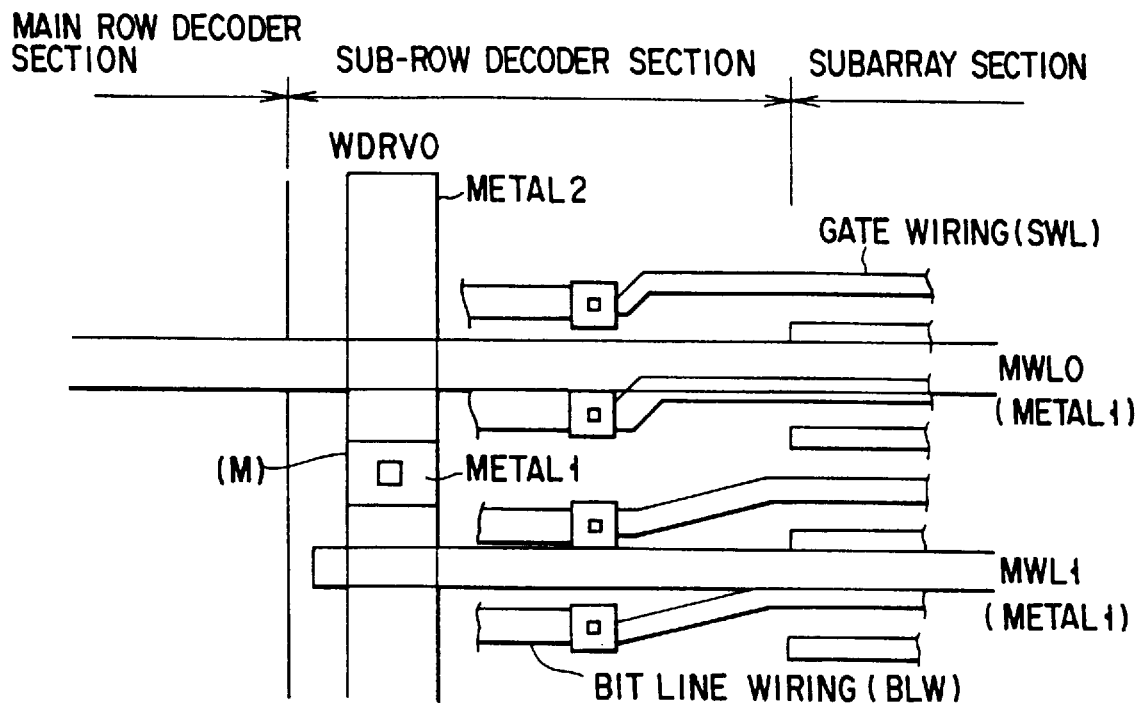
F I G. 21A
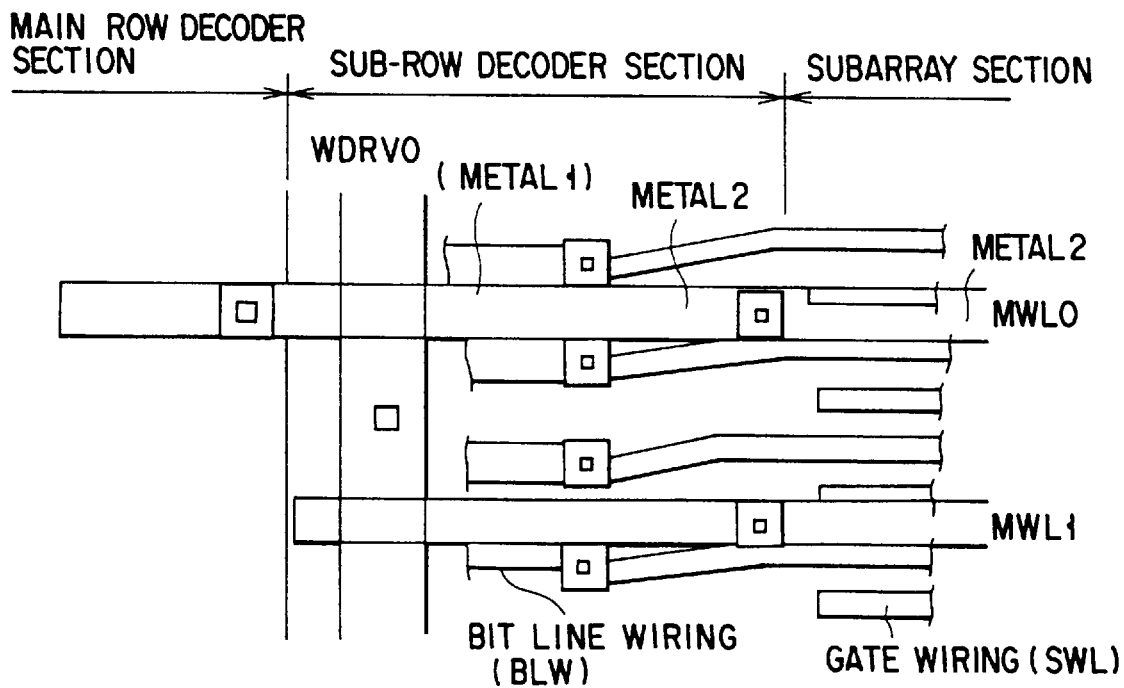
F I G. 21B

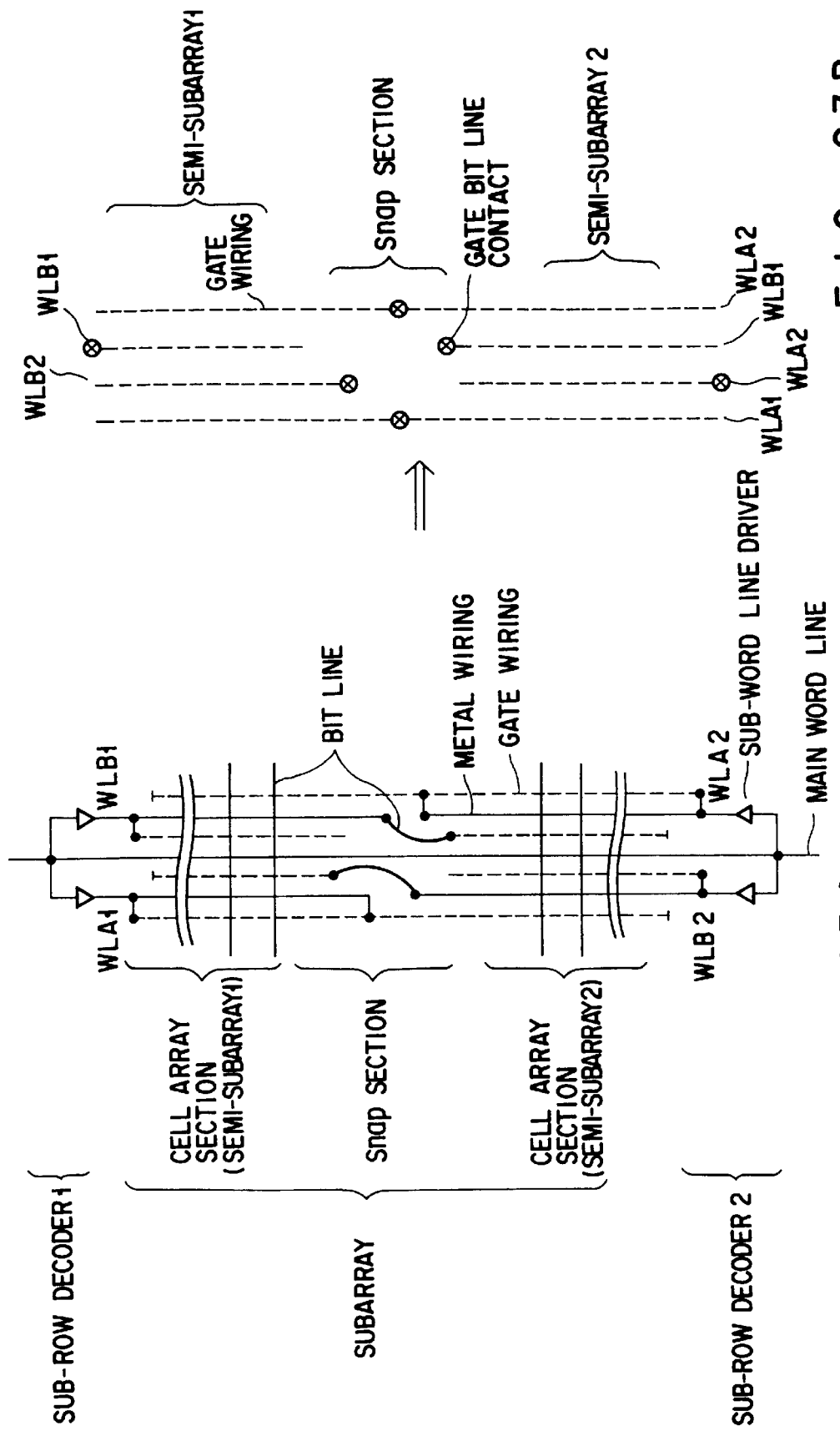

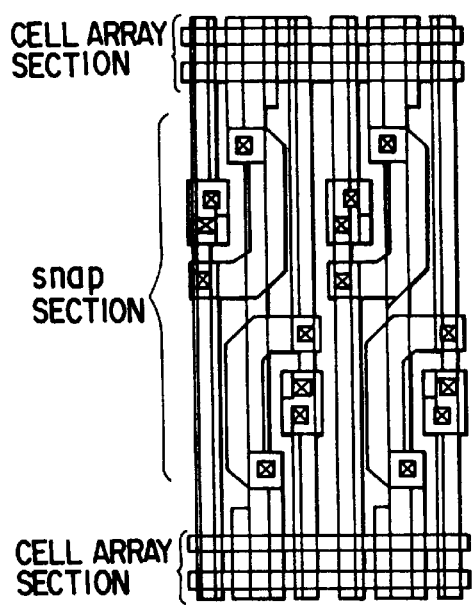
F I G. 24A
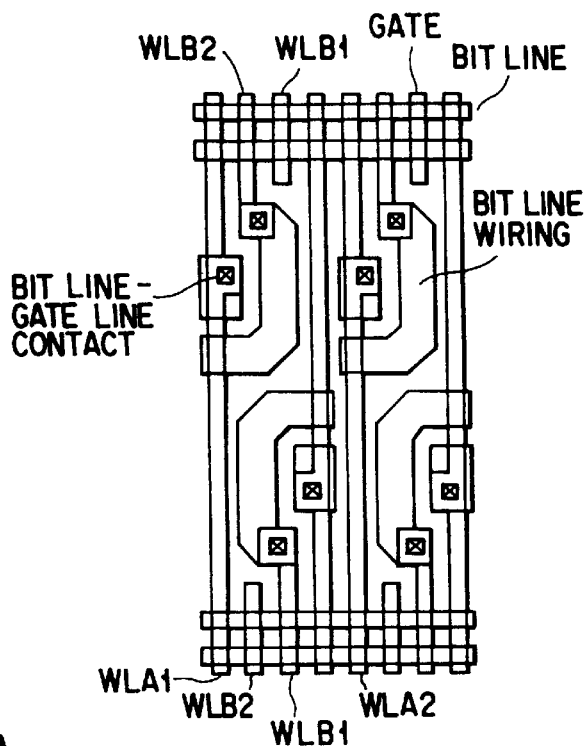
F I G. 24B
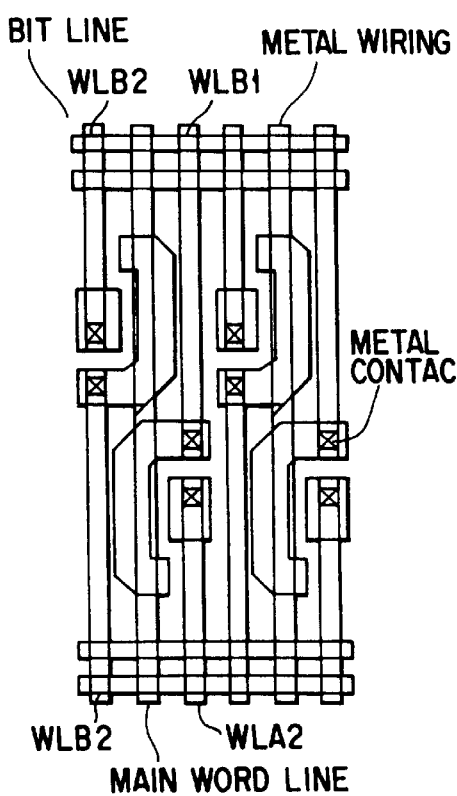
F I G. 24C
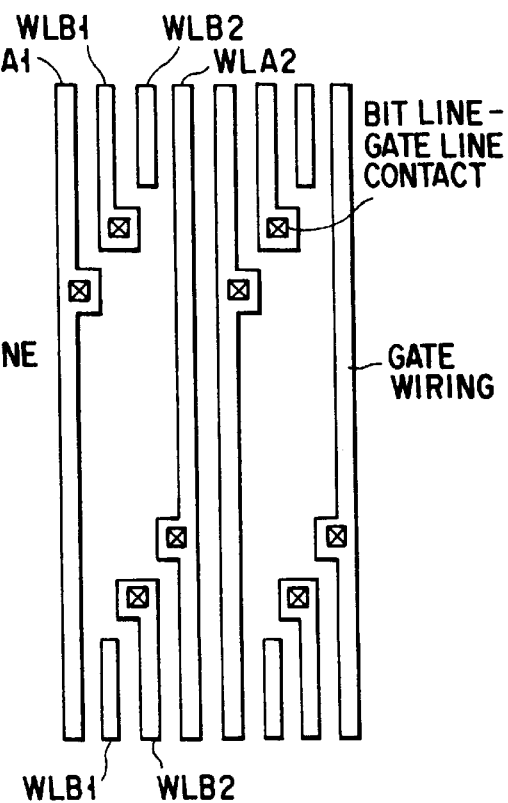
F I G. 24D

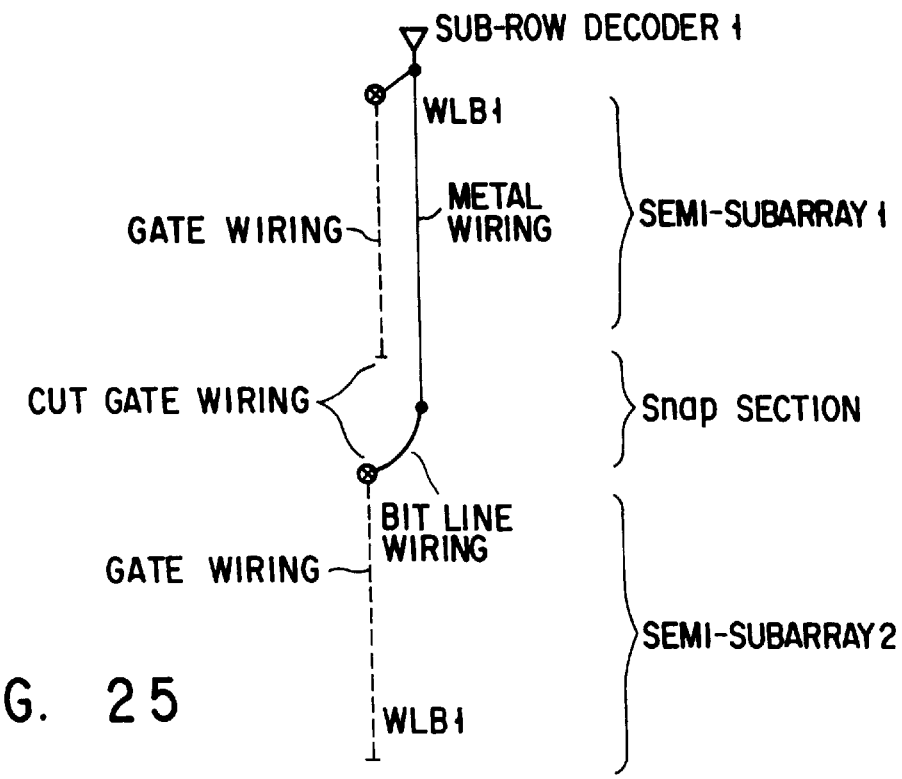
F I G. 25
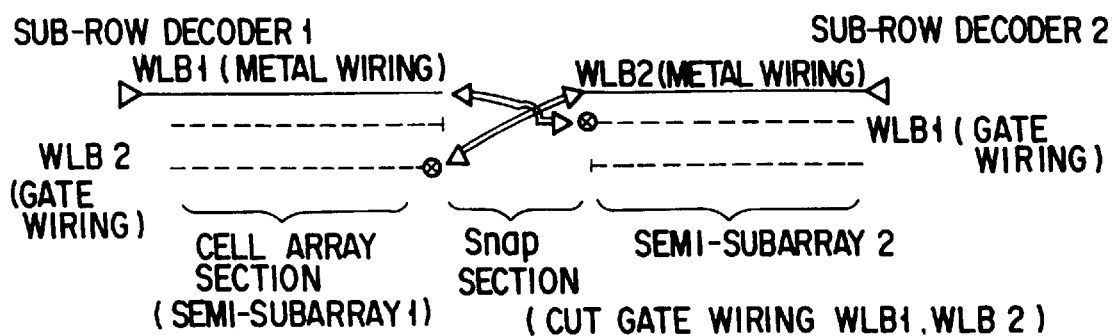
F I G. 26

SEMICONDUCTOR MEMORY DEVICE HAVING IMPROVED WORD LINE ARRANGEMENT IN A MEMORY CELL ARRAY

BACKGROUND OF THE INVENTION

1. Field of the Invention

The present invention relates to a dynamic semiconductor memory device and, more particularly, to a semiconductor memory device in which a word line arrangement in a memory cell array is improved.

2. Description of the Related Art

In recent years, with the development of fine processing technology, 4- or 16-Mbit DRAMs can be manufactured as high-density mass products, and 1-Gbit DRAMs can be manufactured in R & D. However, in submicron generation, due to slow development of lithography technique, processing of wiring or the like is difficult. In particular, processing of a metal wiring or the like formed on an upper layer is difficult due to the underlying step difference or the like.

FIG. 1A shows the arrangement of a cell array section of a conventional DRAM. Memory cells MC1 to MC8 are selectively arranged at the nodes between word lines W1 to W4 and bit lines BL1 and /BL2 and BL2 and /BL2, respectively. Memory cell data of a word line WL selected by the row decoders R/D1 to R/D4 is read through a bit line BL, and amplified by the sense amplifiers S/A1 and S/A2.

When the word line WL is constituted by a gate wiring serving as a wiring for a transistor of a memory cell MC, since the material of the gate wiring has a relatively high resistance, an RC delay of rising/falling in selection is large. For this reason, the following method is known. That is, as shown in FIG. 1B, metal wirings consisting of A1 or the like are parallelly arranged on the gate wiring, a cell array is divided, and the contact between a metal wiring and a gate wiring is established in the middle of each cell array. This contact portion is generally called shunt, snap, or stitch. The contact between a metal wiring and a gate wiring, as shown in FIG. 1C, may be established in such a manner that the metal wiring is connected to the gate wiring through an intermediate wiring.

However, this scheme has the following problem.

As shown in FIG. 1D, the pitch of gate wirings (L1=line, S1=space) must be equal to the pitch of metal wirings (L2=line, S2=space). However, since the upper layer has an underlying step difference, and the metal itself cannot be easily processed, the metal wirings cannot be easily processed.

In recent years, a hierarchy word line scheme which has been used in an SRAM or the like has been tried to be employed in a DRAM. FIG. 2A shows a hierarchy word line scheme in a conventional DRAM. FIG. 2B is a plan block diagram a chip from above.

One main word line (MWL) constituted by metal wirings to which an output from a main row decoder (M•R/D) is supplied is arranged for sub-word line (SWL) serving as gate wirings and consisting of polysilicon or the like. One memory cell array is divided into a plurality of parts, and sub-row decoders (S•R/D) are arranged therebetween. That is, one metal wiring is arranged for four gate wirings.

Each sub-row decoder is decoded in response to a main word line signal and an address signal WDRV output from a bit line direction (not shown) to drive a gate wiring. By decoding performed by the address signal from the bit line direction, the pitch of main row decoders and the pitches of main word lines (metal wirings) for outputs of the main row decoders can be made considerably relax, i.e., four times of the pitch of gate wirings as shown in FIG. 2C. Referring to FIG. 2C, L3+S3=4 (L1+S2) is established.

However, this conventional scheme has the following problem.

In the snap scheme, the number of contacts is only decreased. In contrast to this, in the hierarchy wire line scheme, since sub-row decoder circuits are arranged to be dispersed, an area larger than that required in the snap scheme is required. For this reason, unless the number of columns between S•R/D and S•R/D is larger than the number of columns between snap and snap, the chip size increases. In contrast to this, when the number of columns between S1•R/D and S•R/D in the hierarchy word line scheme is increased, RC delay caused by the resistance of the gate wiring in the subarray increases.

As shown in FIG. 3, in order to obtain a chip size equal to that obtained in the snap scheme, the following equation must be satisfied:

$$2 \times (\text{number of columns/snap}) = \text{number of columns/sub-row decoder}$$

More specifically, the number of columns between S•R/D and S•R/D of the hierarchy word lines must be twice or more the number of columns between snap and snap. The area of the snap portion is twice or more of the area of sub-row decoders. In contrast to this, the number of arrays connected to a main decoder can be set to be larger in the hierarchy word line scheme than in the snap scheme. For this reason, the number of arrays in the hierarchy word line scheme is almost twice the number of arrays in the snap scheme, and the area in the hierarchy word line scheme is almost equal to the area in the snap scheme. At this time, a gate wiring delay RC is determined by the value related to twice the number of columns. For this reason, the following equation is established:

$$(2R) \times (2C) = 4RC$$

and the delay increases to be four times. As a result, in order to keep a constant speed, development for making the resistance of a gate wiring lower than that in the snap scheme must be performed, and the cost of development is required.

The conventional hierarchy word line scheme also has the following problem. Although the rule of a metal wiring on a subarray can be relaxed as shown in FIG. 3, the pitches of the main row decoders and the pitch of the metal wirings of the sub-row decoders cannot be relaxed. As a result, the design rule of the metal wirings is limited to the rules of the main row decoders and sub-row decoders.

In the conventional snap scheme shown in FIGS. 1A to 1D, the rules of row decoders is relaxed compared with the rule on the cell array. However, in the hierarchy word line scheme shown in FIGS. 2A to 2C, since the rules on the subarray is considerably relaxed, the metal wirings are limited to the rules of the main row decoders and sub-row decoders.

For example, referring to FIG. 4, when a contact to the well of a main row decoder is to be formed, a second layer metal wiring (not shown) extending in a bit line direction is brought into contact with a first layer metal wiring (metal 1) to be brought into contact with the well. For this reason, as indicated by (A) in FIG. 4, the pitch of the first layer metal wirings reduces by half. The rule of the contact between the first layer metal wiring and the second layer metal wiring is large, the rule of the first layer metal in the portion (A) is smaller than a half of the rule of the subarray. As in a portion (B) in another word line power supply (VSV), or as in a portion (C), when a signal (S1) from another wiring, e.g., a lower circuit, in the main row decoder is connected to a main word line in parallel, the rule becomes more severe. In addition, as in a sub-row decoder section, a portion such as the portion (A) is present. When a sub-word line is formed by the first layer metal wiring as indicated by (D), the rule becomes more severe.

As described above, with respect to a conventional word line arrangement in a memory cell array, in the snap scheme, processing cannot be easily performed because a metal wiring pitch is severe. In the hierarchy word line scheme, although a pitch is relax, a delay increases unless the resistance of a gate wiring is reduced, and a chip size increases.

In the conventional hierarchy word line scheme, the pitch of the metal wirings on a subarray can be considerably relaxed, but the rules of the metal wirings of the main row decoders and sub-row decoders are constant. As a result, the rule of the metal wirings is limited to the rules of the metal wirings of the main row decoders and sub-row decoders.

SUMMARY OF THE INVENTION

It is an object of the present invention to provide a dynamic semiconductor memory device capable of moderating the rule of metal wirings in a hierarchy word line scheme, and performing a high-speed operation without increasing a chip size or decreasing the resistance of a gate wiring.

It is another object of the present invention to provide a dynamic semiconductor memory device capable of moderating not only the rule of metal wirings on a subarray, but also the rules of main row decoders and sub-row decoders in a hierarchy word line scheme.

In order to solve the above problems, the present invention employs the following arrangements.

The first semiconductor memory device of the present invention comprises a plurality of word lines constituted by gate wirings, a memory cell array having memory cells selectively arranged at nodes between the plurality of word lines and a plurality of bit lines, the memory cell array having a plurality of subarrays which are divided in a word line arrangement direction, a main row decoder arranged at least one end of the memory cell array in the word line arrangement direction, a plurality of sub-row decoders arranged at least one end of each of the plurality of subarrays, and a first wiring layer formed on a layer above the gate wirings and extending from the sub-row decoder, wherein the first wiring layer is wired to a position where the subarray is divided by two in the word line arrangement direction to be brought into contact with the gate wiring.

In this case, the plurality of subarrays include two sub-subarrays which are divided by two in the word line arrangement direction, and one of each two gate wirings of the subarray is cut at a boundary portion between the two sub-subarrays. A word line from the subarray having a gate wiring which is not cut is brought into contact with the first wiring layer at the boundary between the two sub-subarrays, a word line of the word lines from the subarray having a gate wiring which is cut, a word line which is close to the sub-row decoder for driving the corresponding word line is brought into contact with the first wiring layer at a boundary portion between the sub-row decoder and the subarray, and a word line of the word lines from the subarray having a gate wiring which is cut, a word line which is apart from the sub-row decoder for driving the corresponding word line is brought into contact with the first wiring layer at a boundary portion between the sub-subarrays.

Desirable aspects of the first semiconductor memory device of the present invention are as follows.

(1) The plurality of sub-row decoders are added at a first end and a second end of the subarray, the first wiring layer from the sub-row decoder arranged at the first end and the first wiring layer from the sub-row decoder arranged at the second end are wired to the two-division position and arranged on an almost identical straight line in the word line arrangement direction to be electrically insulated from each other not to overlap.

(2) The main row decoder and the sub-row decoder are connected to each other by using the same wiring layer as the first wiring layer.

(3) The main row decoder and the sub-row decoder are connected by the same wiring layer as the first wiring layer on the subarray, and are connected to each other by a wiring layer different from the first wiring layer on the sub-row decoder.

(4) The first wiring layer is made of a wiring including aluminum or copper as main component.

(5) The gate wiring is a wiring containing one of polysilicon, tangsten-silicide, tungsten, molybdenum-silicide, molybdenum and titanium-silicide.

(6) The main row decoder is arranged at each of both the ends of the memory cell array in the word line arrangement direction.

(7) Three the first wiring layers are arranged in an area in which four the gate wirings are arranged.

(8) Five the first wiring layers are arranged in an area in which eight the gate wirings are arranged.

(9) The first wiring layers includes a main gate wiring and a plurality of subgate wirings.

(10) The sub-row decoder includes one drive circuit arranged for two word lines.

(11) A contact from the first wiring layer to the gate wiring is formed through a second wiring layer.

According to the present invention, in the hierarchy word line scheme, a first wiring layer (metal wiring) extending from a subarray is formed on a layer above a gate wiring, and the contact between the first wiring layer and the gate wiring is formed at a position (almost intermediate point) where a subarray is divided by 2 in a word line direction. For this reason, the pitch of metal wirings which is more relax than that obtained when the metal wirings extending from the sub-row decoder are directly used as gate wirings, can be obtained, and an RC delay can be reduced without decreasing the resistance of the gate wirings.

More specifically, while the pitch of the metal wirings is relaxed to be 4/3, 8/5, or more times the pitch of the gate wirings, an increase in chip size is eliminated, and the RC delay caused by the gate wirings can be made equal to that in a conventional snap scheme. For this reason, the development of a low-resistance gate material is not necessary. In addition, when the RC delay of the gate wirings is made equal to that in a conventional hierarchy word line scheme while moderating the pitch, the number of sub-row decoders can be reduced by half, and the chip size can be reduced.

In addition, according to the present invention, one of each two wirings at the boundary portion of two sub-subarray in a subarray is cut, and each word line whose gate wiring is not cut is brought into contact with the first wiring layer at the boundary portion of the sub-subarray. Each word line whose gate wiring is cut and which is close to a sub-row decoder for driving the corresponding word line is brought into contact with the first wiring layer at the boundary portion between the sub-row decoder and the subarray, and each word line which is away from the sub-row decoder is brought into contact with the first wiring layer at the boundary portion between the sub-subarrays. Therefore, at the contact portion from the upper layer wiring to the gate, only contacts to two gates at the pitch of four word lines need be formed, the margin of a gate material to a contact can be widened to the width of a gate material or the intervals between gate materials.

As described above, according to the present invention, while the pitch of metal wirings is relaxed to be 4/3, 8/5, or more times the pitch of gate wirings, an increase in chip size is eliminated, and an RC delay caused by gate wirings can be made equal to an RC delay in the conventional snap scheme. In addition, development of a low-resistance gate material is not necessary. When the RC delay of gate wirings is made equal to the RC delay in the hierarchy word line scheme while the pitch is relaxed, the number of sub-row decoders can be reduced by half, and the chip size can be reduced.

The second semiconductor memory device of the present invention comprises a plurality of word lines constituted by gate wirings, a memory cell array having memory cells selectively arranged at nodes between the plurality of word lines and a plurality of bit lines, the memory cell array having a plurality of subarrays which are divided in a word line arrangement direction, main row decoders arranged at both ends of the memory cell array in the word line arrangement direction, a plurality of sub-row decoders arranged at least one end of each of the plurality of subarrays, and a main word line, arranged on the memory cell array for at least two of the plurality of word lines, for controlling the plurality of sub-row decoders, wherein every other the main word line is alternately connected to the main row decoder arranged at one end of the memory cell array and the main row decoder arranged at the other end.

Desirable aspects of the present invention are as follows.

(1) The main word line is a first metal wiring on the subarray, and is switched to a second metal wiring on the sub-row decoder.

(2) The gate wiring on the subarray is switched to the same wiring as the bit line on the sub-row decoder.

According to the second semiconductor memory device of the present invention, when main row decoders are arranged at both the ends of a cell array in a hierarchy word line scheme, and every other main word line wiring is alternately connected to the main row decoders at both the ends, the pitch of metal wirings on the subarray can be relaxed, and the pitch of metal wirings in the main row decoder can be relaxed to be twice that in the prior art.

In the hierarchy word line scheme, although the pitch of metals 1 on the subarray can be relaxed, the pitch of main row decoders and the pitch of the sub-row decoders metals 1 are constant. As a result, the pitch of the metals 1 is limited to the pitch of the main row decoders and the pitch of the sub-row decoders. In contrast to this, main row decoders are arranged at both the ends of a cell array, every other main word line wiring is alternately connected to the main row decoders at both the ends. For this reason, the pitch of the main row decoders can be relaxed to be twice that in the prior art.

When connection can be switched by the first metal wiring on the sub array, and connection can be switched to the second metal wiring on the sub-row decoder, the metal wirings in the sub-row decoder are switched in a bit line direction. For this reason, the rule can be relaxed without limits. In addition, when the portion on the sub-row decoder is used only to temporarily drop the main word line and the first metal wirings from the bit line direction to the first metal wirings and drop them to a lower layer, and is not used for the wiring of a sub-word line or the like, the pitch of the first metal wirings of the sub-row decoder section can be relaxed.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A to 1D are views showing the arrangements of cell array sections in a conventional DRAM, respectively;

FIG. 14 is a view showing a concrete circuit according to the third embodiment;

FIGS. 21A and 21B are views showing the layouts of sub-row decoder sections in the eighth embodiment, respectively;

FIG. 23A and 23B is views showing a drive circuit of word lines, a gate wiring, the wiring of a layer above a gate according to the tenth embodiment;

FIGS. 24A to 24D are views showing the layouts of boundary portions between sub-subarrays in the tenth embodiment, respectively;

FIG. 25 is a view showing the wiring structure of a word line in the tenth embodiment;

FIG. 26 is a view for explaining crossing between wirings at the boundary portion of sub-subarray.

DETAILED DESCRIPTION OF THE PREFERRED EMBODIMENTS

Embodiments will be described below with reference to the accompanying drawings.

Embodiment 1

Figure 5:
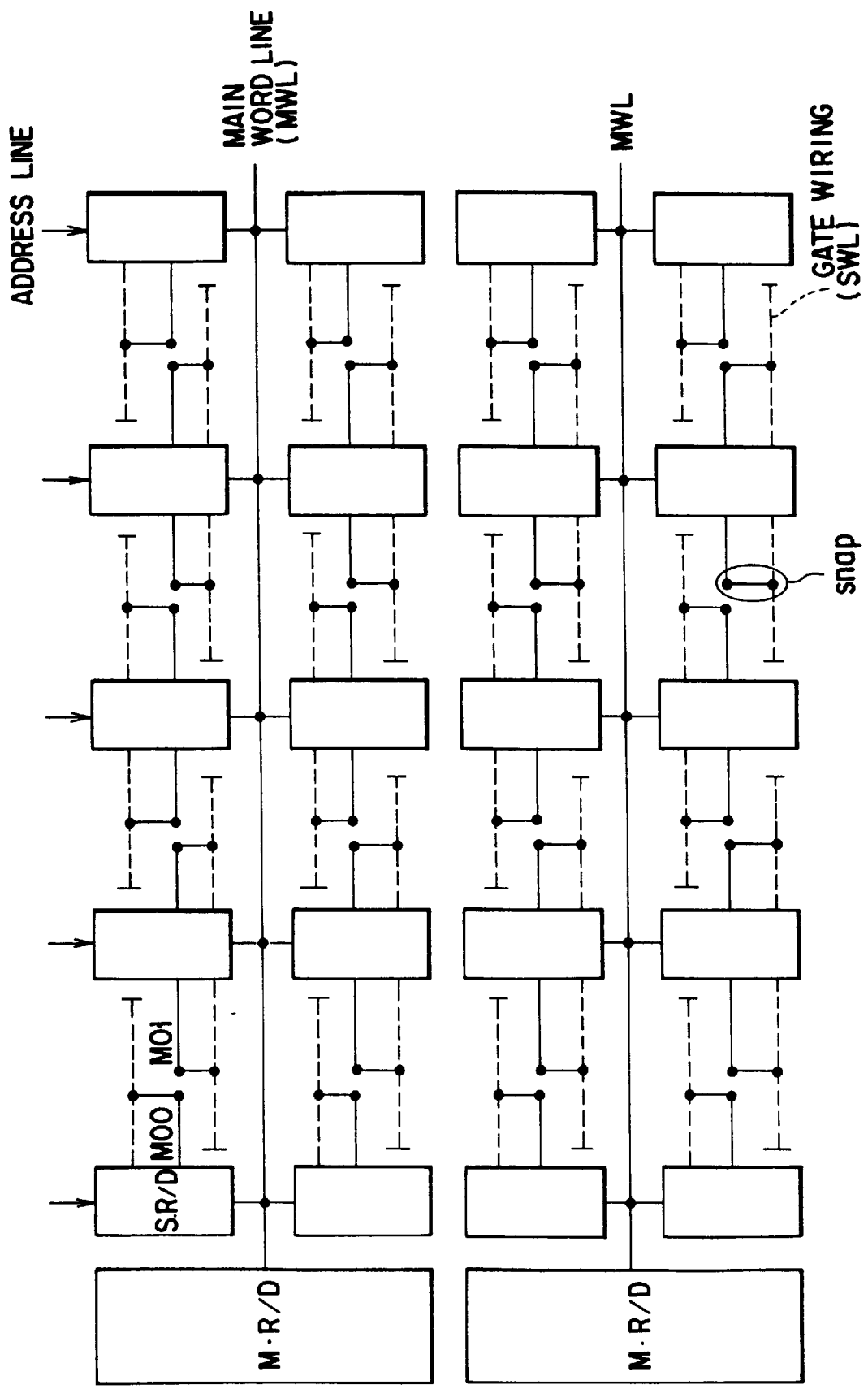
FIG. 5 is a view showing the arrangement connection relationship of a memory cell array section and a low decoder section in a DRAM according to the first embodiment.

FIG. 5 is a view showing the arrangement connection relationship between a memory cell array section and a low decoder section in a DRAM according to the first embodiment of the present invention.

A main row decoders (M•R/D) is arranged at each end of a memory cell array, and a main word line (MWL) for an output from the main row decoder passes over the memory cell array for every four gate wirings. The memory cell array is divided by two or more into subarrays (SA) in a main word line direction, and a sub-row decoder (S•R/D) is arranged therebetween. As in the conventional scheme, this sub-row decoder is decoded by an address signal from the main word line and a bit line direction (not shown), one word line in a selected subarray is selected. Note that the main word line is a metal wiring consisting of Al or the like, and the gate wiring consists of polysilicon or the like.

This embodiment is different from the prior art in the following point.

An output from a conventional sub-row decoder is directly supplied from the sub-row decoder into a subarray as a gate wiring. However, in this embodiment, a metal wiring layer identical to a main word line and a subarray from a sub-row decoder are extend to the almost central position (two-division point) of the subarray, and a contact to the word wiring is formed at the division point as in a snap scheme. More specifically, a metal wiring (M00) of the sub-row decoder output arranged at one end of the subarray is connected to the gate wiring at the two-division point, and a metal wiring (M01) of a sub-row decoder output arranged at the other end of the subarray is connected to the gate wiring at the two-division point. In this case, these metal wirings are desirably arranged not to be parallel to the word line direction, i.e., the metal wirings M00 and M01 are desirably arranged along a straight line.

With the above arrangement, only three metal wirings (one main word line and two wirings for snap) need be arranged for four gate wirings, and the pitch of metal wirings can be 4/3 times the pitch of conventional gate wirings. For example, assume that the line/space of gate wirings in an 1-Gbit DRAM class is set to be 0.18/0.2 $\mu$m. In this case, the line/space of metal wirings is relaxed to be 0.24/0.26 $\mu$m. Therefore, the wirings can be satisfactorily processed by a wiring processing apparatus for a DRAM one or half generation ago.

Figure 6:
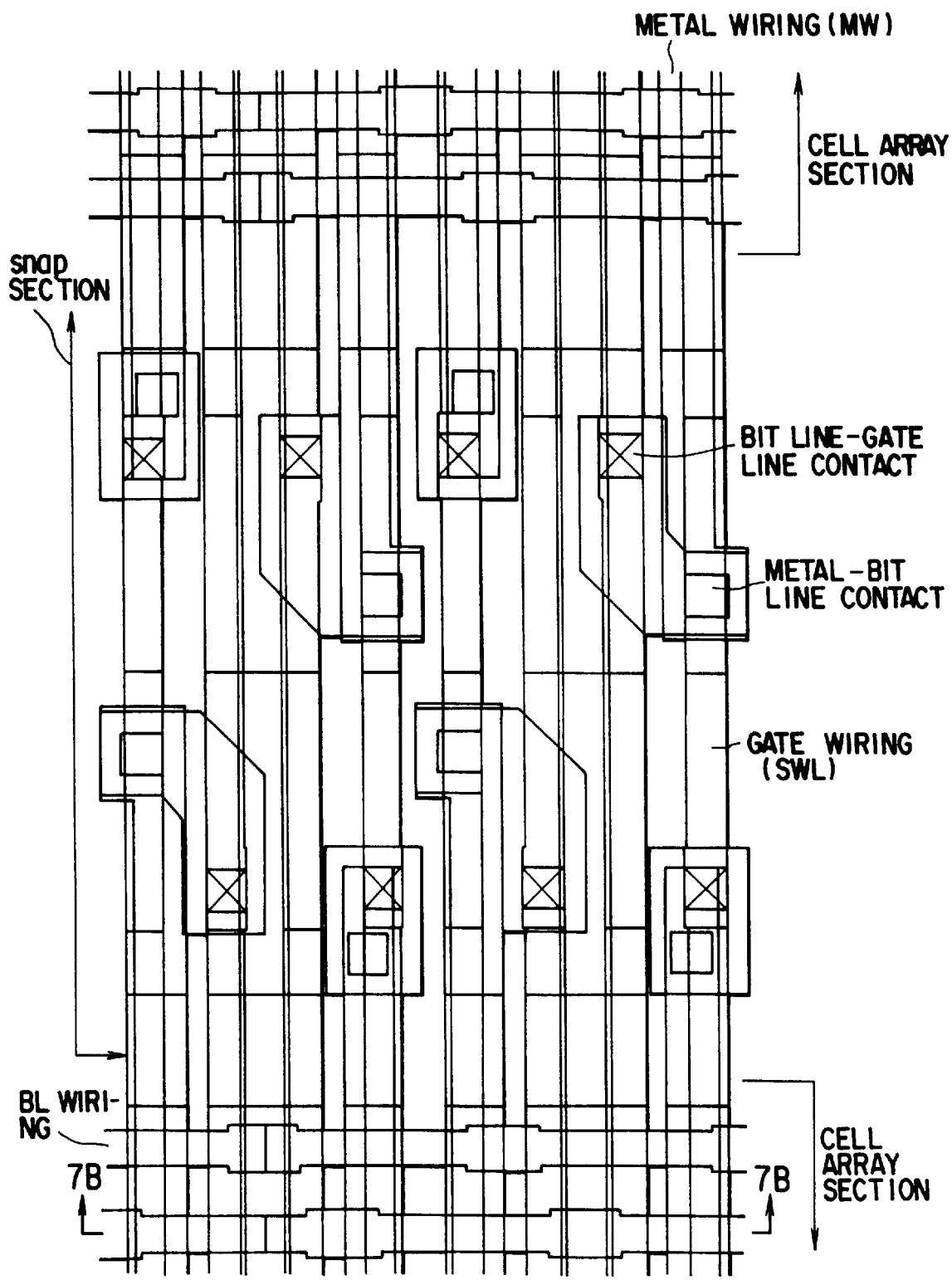
FIG. 6 is a view showing the layout of the contact portion between a metal wiring and a gate wiring at a position where the subarray of the first embodiment is divided by two.

FIG. 6 is a view showing the layout of the contact portion between a metal wiring and a gate wiring at a position where the subarray of this embodiment is divided by two. FIG. 7 is a stick view of FIG. 6.

Figure 7A:
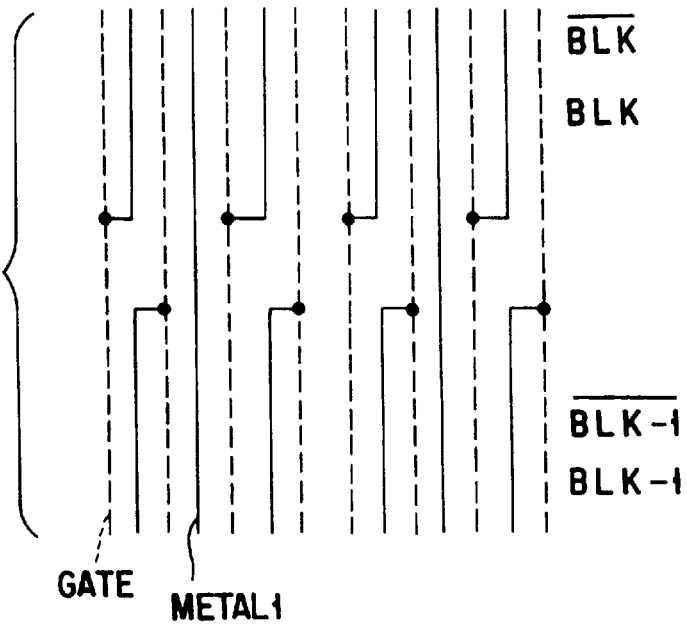
FIGS. 7A to 7D are views showing the arrangements of the sections of the first embodiment, respectively.
Figure 7B:
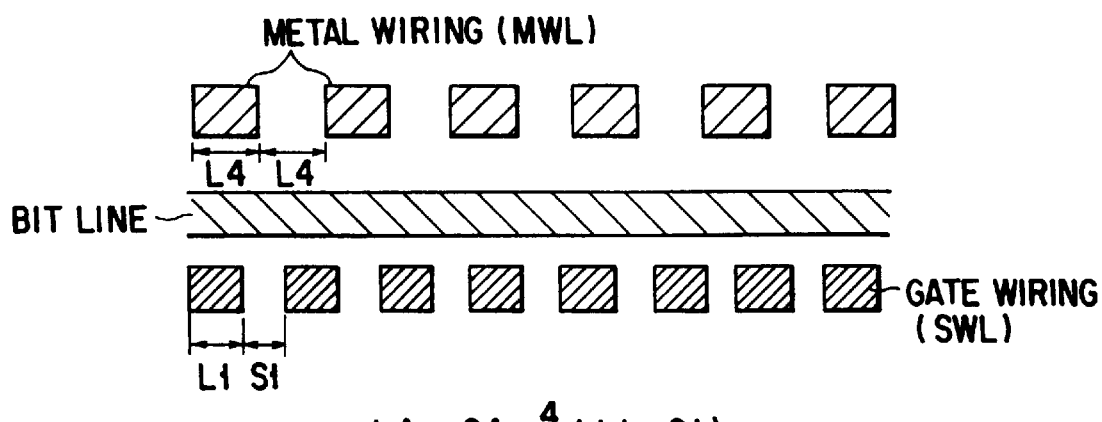
Figure 7C:
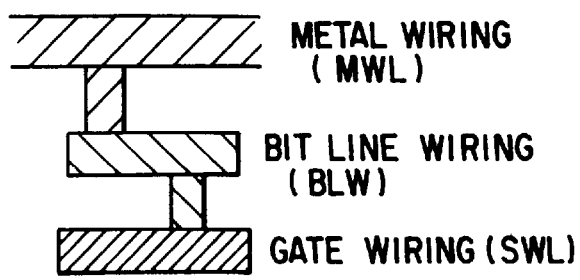
Figure 7D:
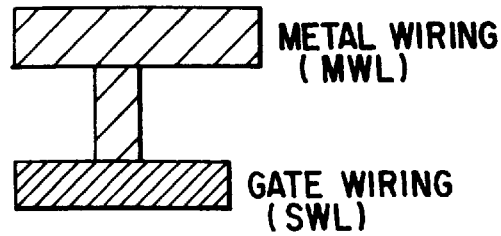

In an example in FIG. 6, eight gate wirings are arranged for six metal wirings. The second and fifth metal wirings from the left side are main word line wirings, while the first, third, fourth, and sixth metal wirings of the upper portion of FIG. 7A are terminated at their snaps in response to a signal, provided by the sub-row decoder of the upper portion. As shown in FIG. 7C, each metal wiring is connected to a gate wiring through a bit line. The first, third, fourth, and sixth metal wirings of the lower portion of FIG. 7A are terminated at its snap portion in response to a signal of the sub-row decoder of the lower portion, and connected to the gate wirings. As shown in FIG. 7D, a metal wiring may be directly connected to a gate wiring.

In this manner, the first, third, fourth, and sixth metal wirings of the upper portion are not parallel to the first, third, fourth, and sixth metal wirings of the lower portion, and each pair of metal wirings of the upper and lower portions extend on an almost identical straight line. As a result, as shown in FIG. 7B, only three metal wirings need be arranged for four gate wirings, and a design rule can be relaxed.

Figure 8:
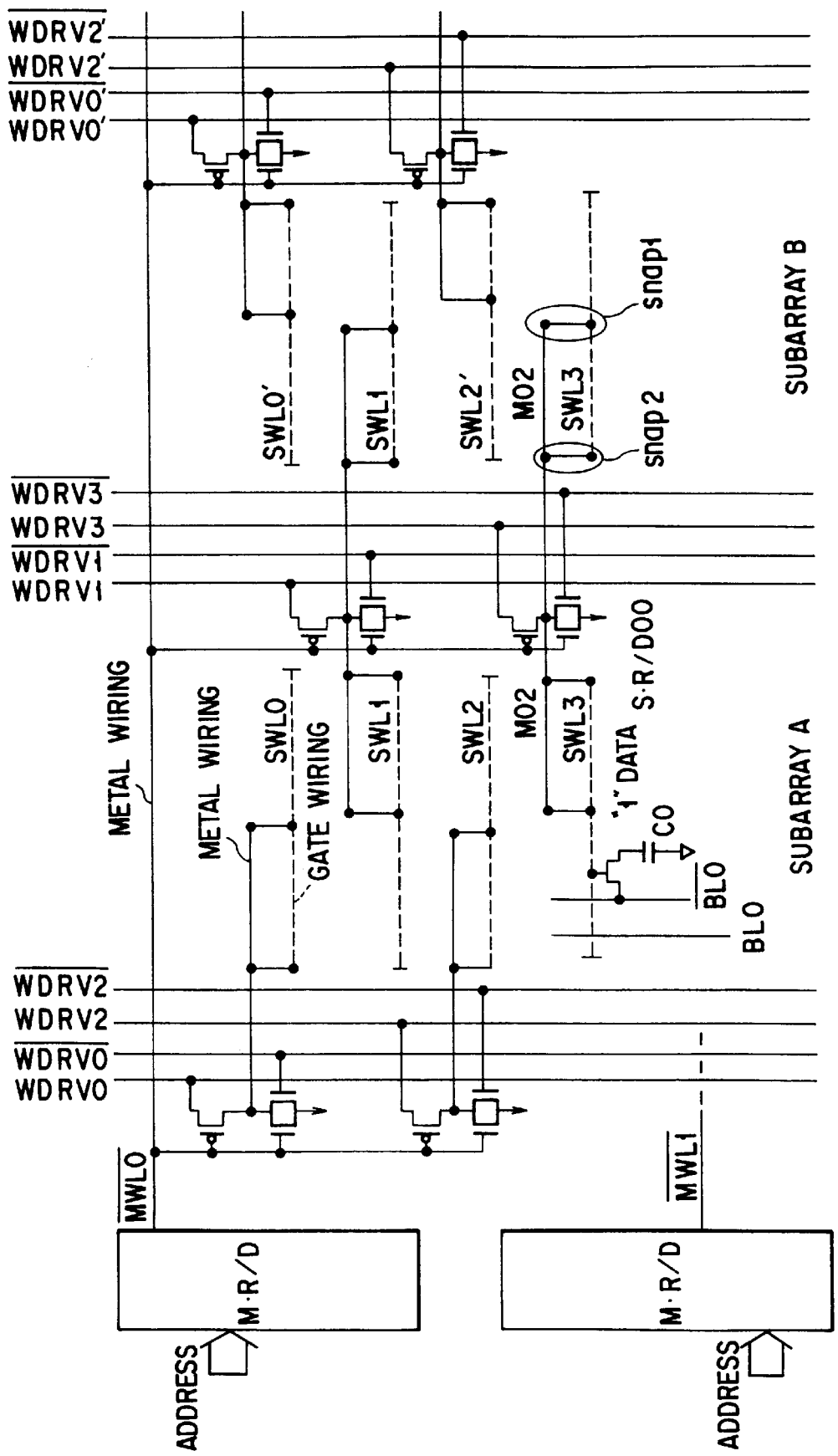
FIG. 8 is a view showing the first embodiment by using a concrete circuit.
Figure 9:
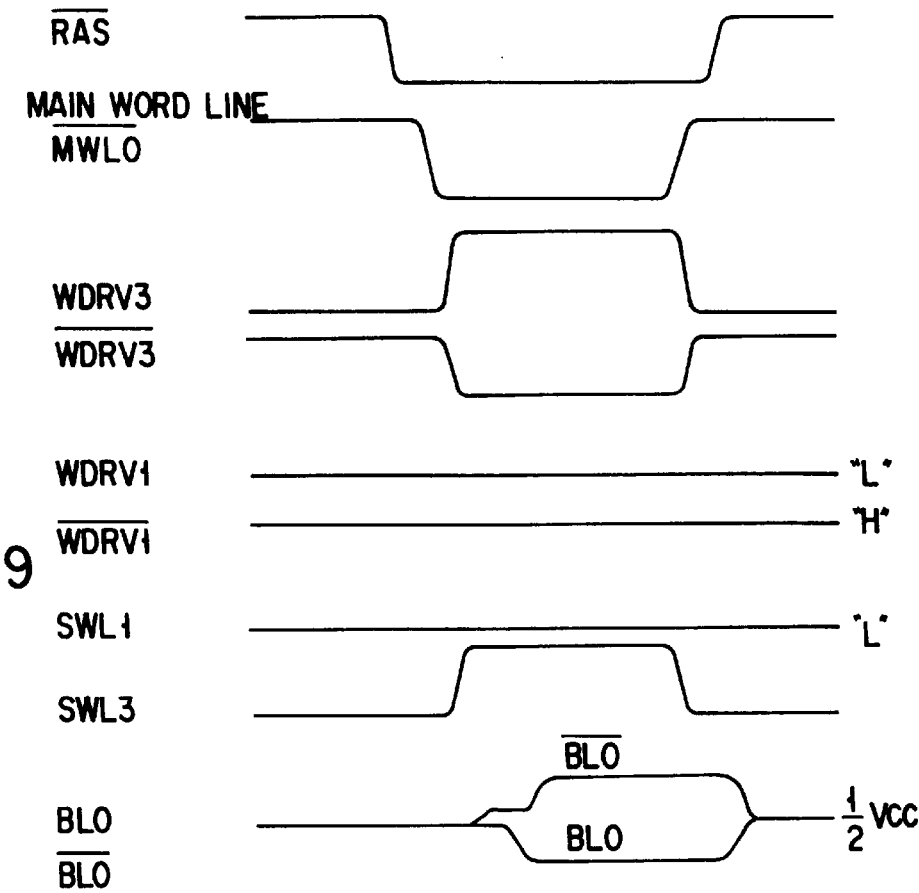
FIG. 9 is a view for explaining an operation of the circuit in FIG. 8.

FIG. 8 is a view showing this embodiment by using a concrete circuit, and FIG. 9 shows an operation of the circuit.

For example, assume that a main word line /MWL0 is selected, the level drops from "H" level to "L" level, and that an address WDRV3 from a bit line direction is selected, WDRV3 rises, and /WDRV3 drops. In this case, a sub-row decoder S•R/D00 is activated, and a metal wiring M02 connected to the sub-row decoder S•R/D00 rises. A memory transistor is turned on, data is read.

As shown in FIG. 8, a contact between a metal wiring and a gate wiring in the subarray may be formed at not only the portion of snap1 at the center of the subarray but also the portion of the outlet of the sub-row decoder (snap2).

With the above arrangement, the RC delay of an actual gate wiring is not determined by the number of S•R/D—S•R/D columns as in a conventional hierarchy word line scheme, but by half of the number of S•R/D—S•R/D columns, i.e., the gate wiring length for the number of (S•R/D)-(snap) columns.

Figure 10:
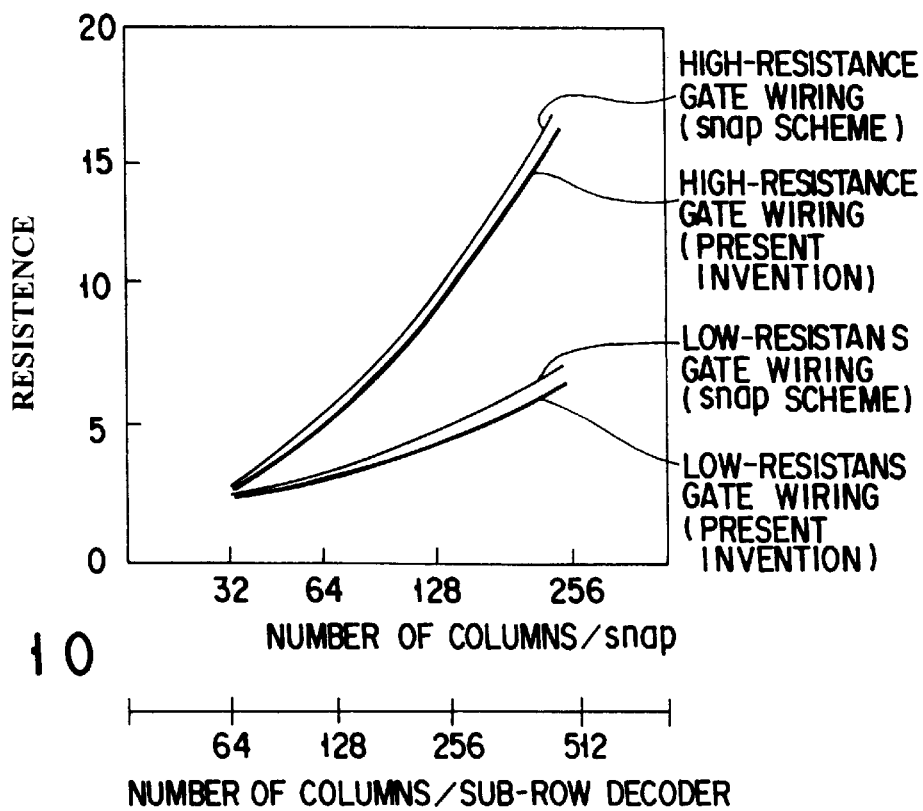
FIG. 10 is a graph for explaining a gate delay in the present invention.

FIG. 10 shows a gate delay of the present invention. According to the present invention, in the number columns/sub-row decoder twice the number of columns/snap in a conventional snap scheme, a gate wiring delay is constant. This is because the RC delay is not determined by the number of columns/sub-row decoder, but by half of the number of columns/sub-row decoder, i.e., a snap-S•R/D gate wiring length.

When the chip size is equal to the chip size of the conventional hierarchy word line scheme, i.e., when the sub-row decoder is divided by the same number (the area of the snap portion can be neglected compared with the area of the sub-row decoder), the RC delay of gate wirings can be reduced to be $$R/2 \times C/2 = RC/4$$

i.e., ¼, while the metal wiring rule. This means that the resistance of the gate wirings need not be decreased.

In contrast to this, the sub-row decoder is divided by half the number of divided subarrays in the hierarchy word line scheme in the present invention, the number of sub-row decoders can be reduced while moderating the rule, and a gate delay can be made equal to the gate delay in the hierarchy word line scheme while reducing the chip size.

A chip size equal to that in a conventional snap scheme can be obtained by the number of columns/sub-row decoder twice the number of columns/snap in the snap scheme. At this time, the number of snap-snap columns in the snap scheme is equal to the number of snap-S•R/D columns of the present invention. For this reason, an RC delay equal to that in the snap scheme can be obtained. Therefore, the rule of metal wirings can be relaxed while a chip size and a gate delay which are equal to those in the snap scheme can be obtained. This means that a low-resistance gate need not be developed, and the rule can be relaxed.

Embodiment 2

Figure 11:
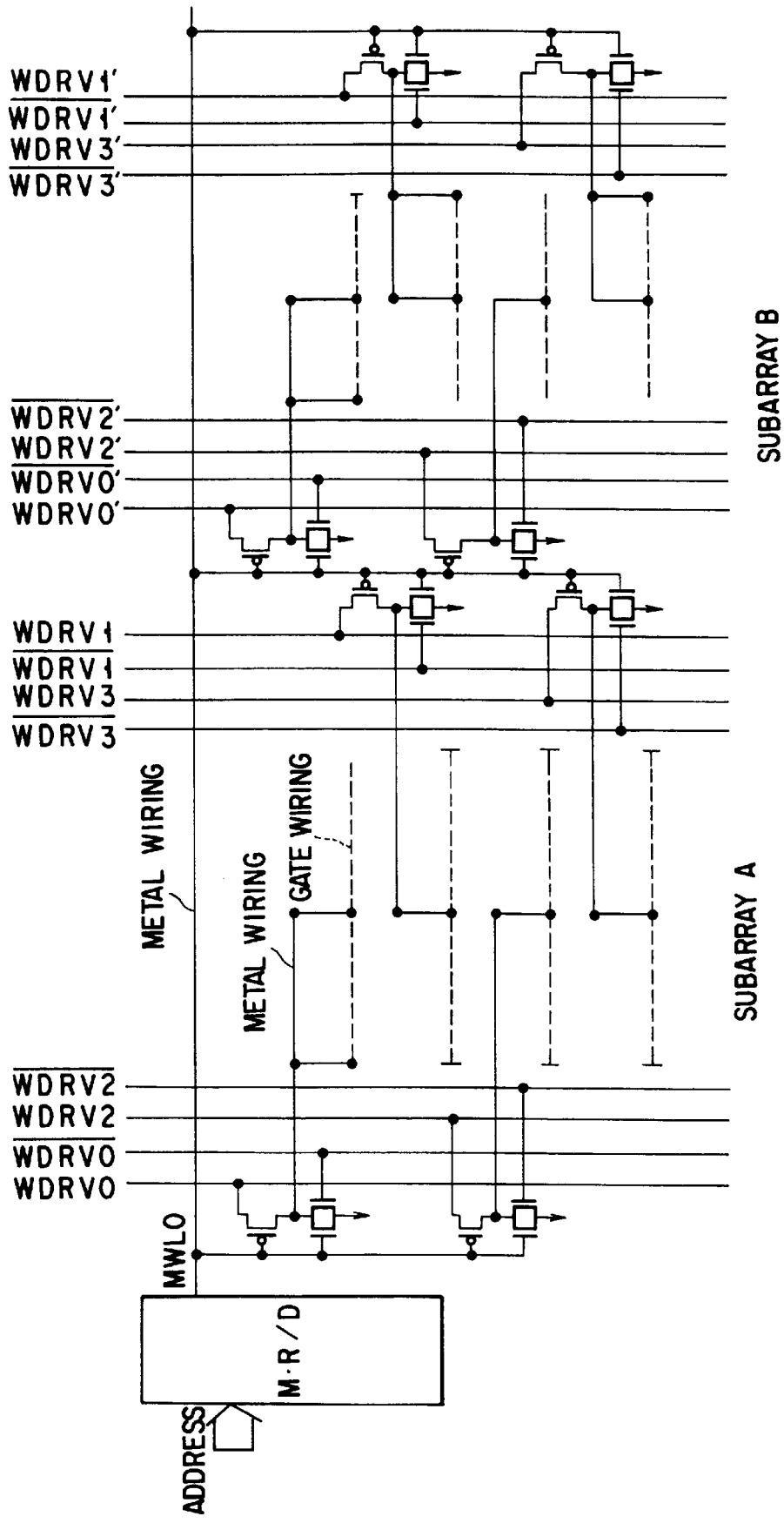
FIG. 11 is a view showing the arrangement connection relationship between a memory cell array section and a low decoder section in a DRAM according to the second embodiment by using a concrete circuit.

FIG. 11 is a view showing the arrangement connection relationship between a memory cell array section and a low decoder section in a DRAM according to the second embodiment by using a concrete circuit. FIG. 11 is different from FIG. 8 in the number of sub-row decoders which are arranged.

An output of a sub-row decoder between a subarray A and a subarray B is shared by the subarrays A and B in FIG. 8, but the subarrays A and B can be independently operated in FIG. 11. This is because an address from a bit line direction is controlled by WDRV3 and WDRV1 in the subarray A and controlled by WDRV0' and WDRV2' in the subarray B.

The number of transistors of a sub-row decoder circuit becomes twice the number of transistors in FIG. 8, but a load on each transistor becomes half the load in FIG. 8 because only one subarray is driven. For this reason, a total area of the circuit in FIG. 11 is equal to a total area of the circuit in FIG. 8. In this manner, in the circuit in FIG. 11, only one subarray can be activated, thereby achieving low power consumption.

Embodiment 3

Figure 12:
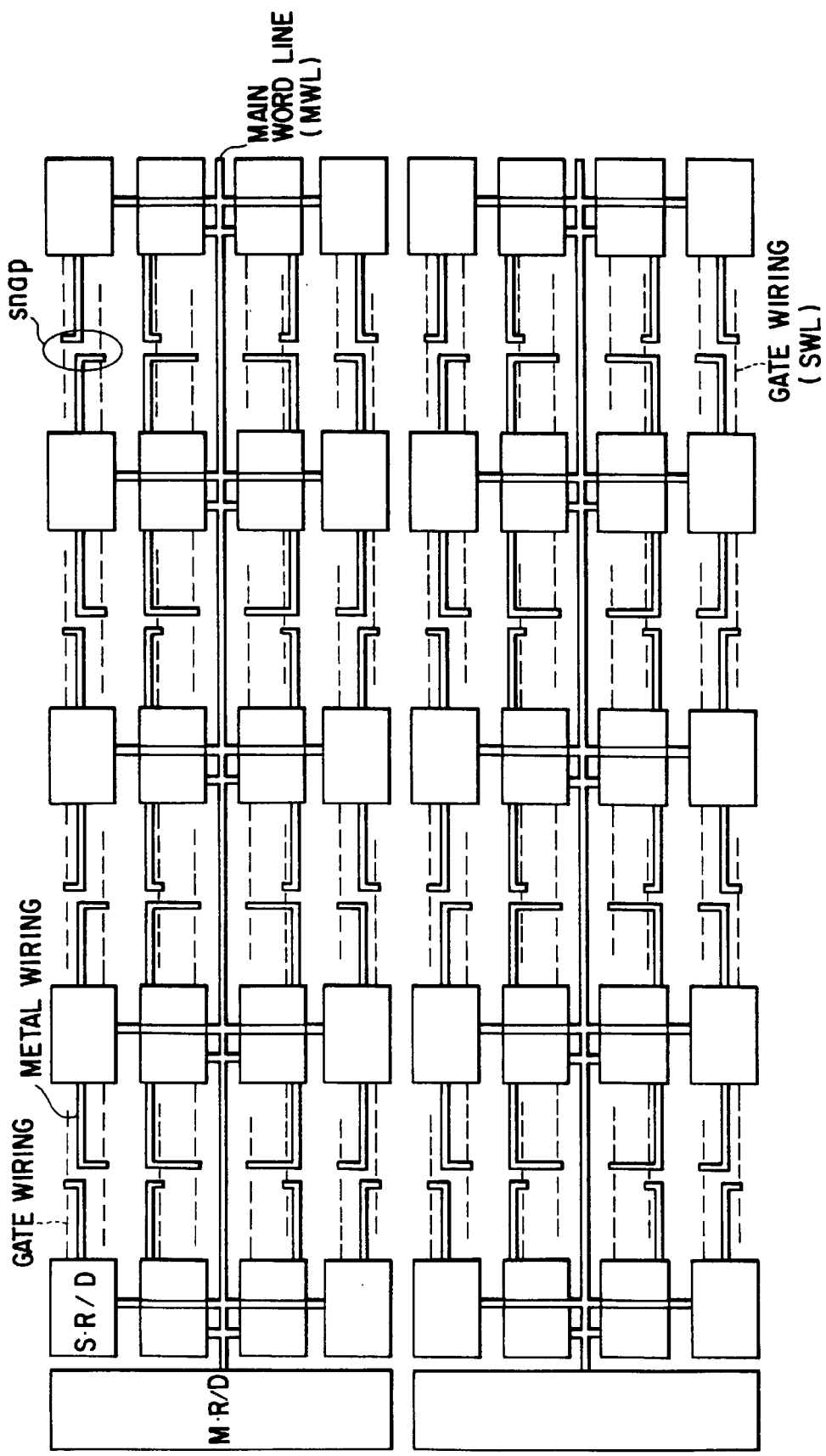
FIG. 12 is a view showing the arrangement connection relationship between a memory cell array section and a low decoder section in a DRAM according to the third embodiment.

FIG. 12 is a view showing the arrangement connection relationship between a memory cell array section and a low decoder section in a DRAM according to the third embodiment.

Figure 13:
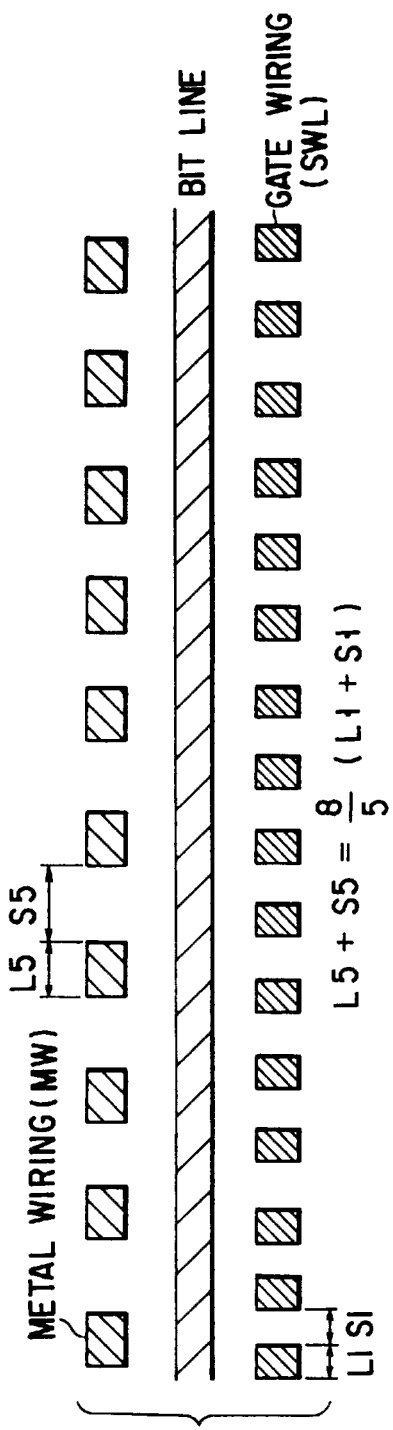
FIG. 13 is a view showing a wiring pitch in the third embodiment.

In this embodiment, one main row decoder (M•R/D) and one main word line (MWL) serving as a metal wiring are arranged for eight gate wirings, and the outputs of four metal wirings extend from each sub-row decoder (S•R/D). In this embodiment, as in FIG. 13, 5 (=1+4) metal wirings are arranged for eight gate wirings. For this reason, while the pitch of metal wirings can be relaxed to be 8/5 or less times, i.e., (L5+S5)=8(L1+S1)/5, the same effect as that of the first embodiment can be obtained.

FIG. 14 shows a concrete circuit of this embodiment. When one main word line (MWL) is arranged for eight gate wirings (SWL), addresses from a bit line direction which are twice in number the addresses in FIG. 8 are required. In this embodiment, a subarray shown in FIG. 11 can be arranged.

Although a sub-row decoder is constituted by a CMOS in each of FIGS. 8, 11, and 14, the sub-row decoder may be constituted by an nMOS or another circuit.

Embodiments 4 and 5

Figure 15:
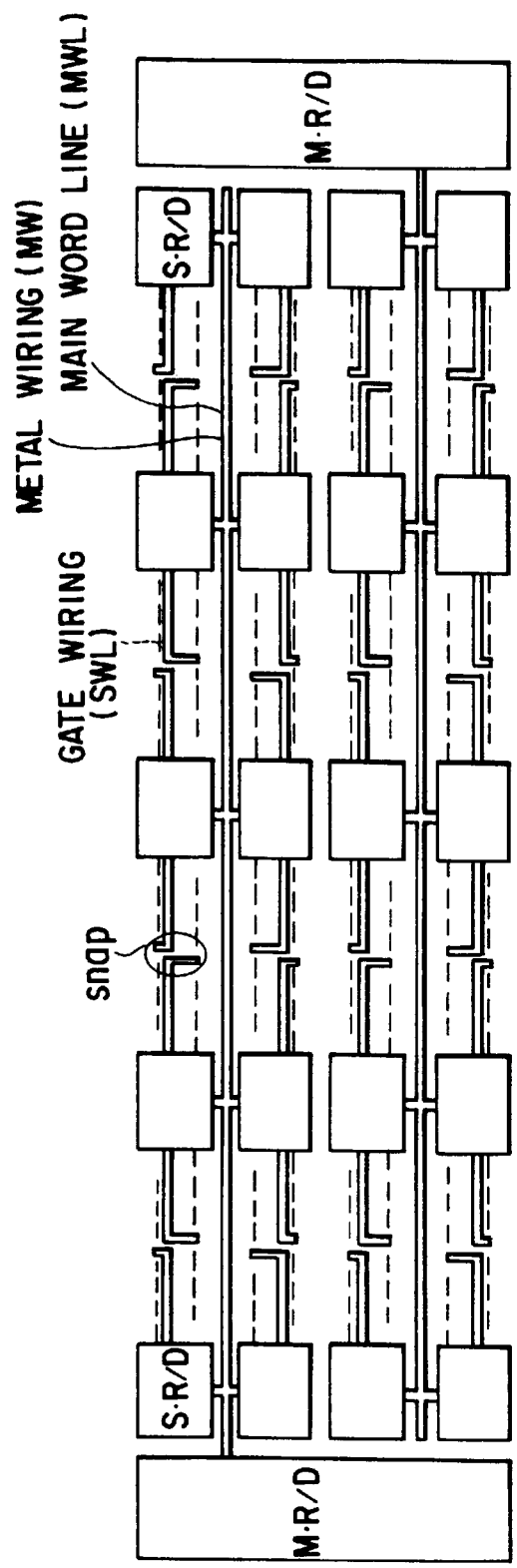
FIG. 15 is a view showing the arrangement connection relationship between a memory cell array section and a low decoder section in a DRAM according to the fourth embodiment.
Figure 16:
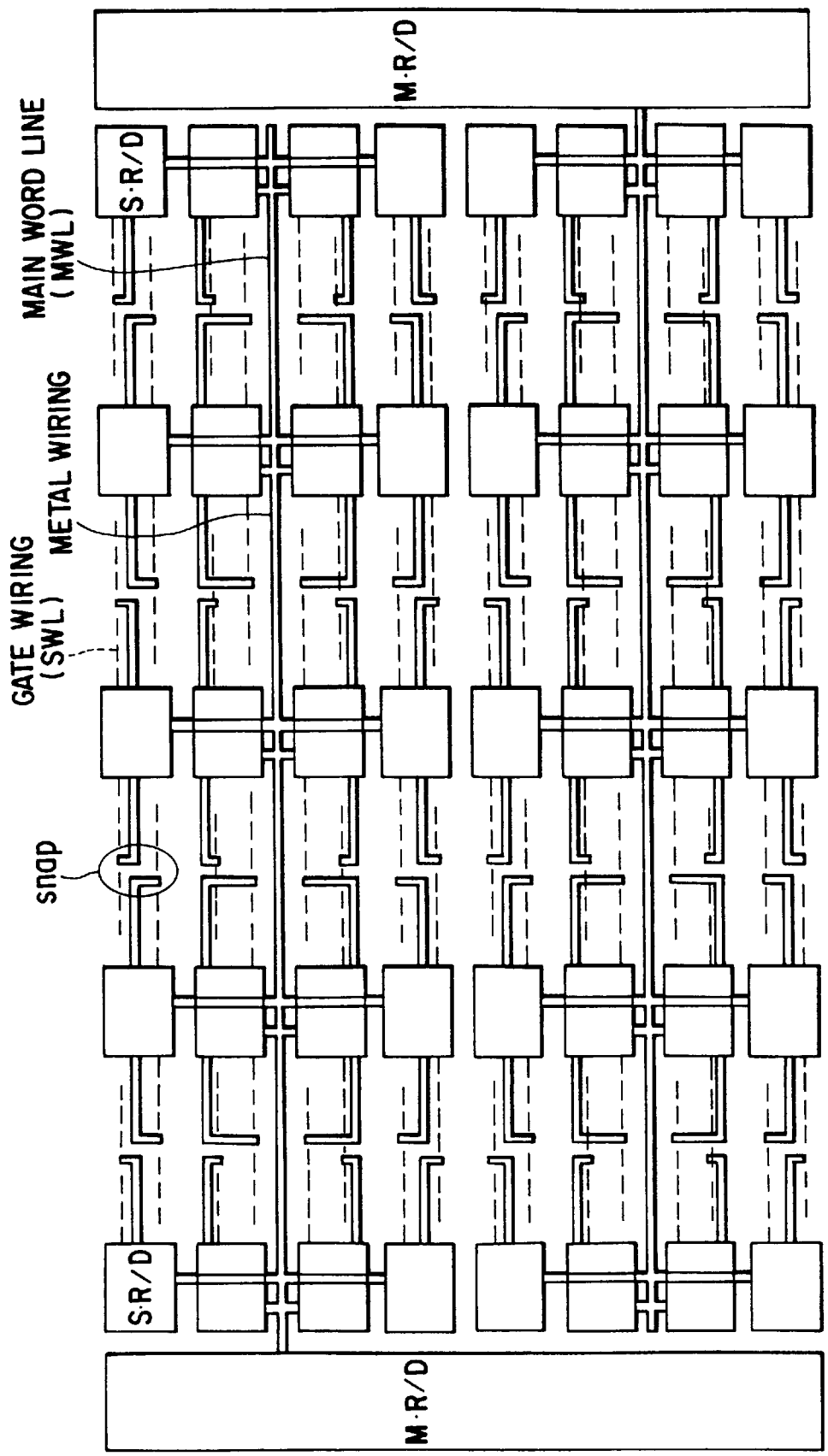
FIG. 16 is a view showing the arrangement connection relationship between a memory cell array section and a low decoder section in a DRAM according to the fifth embodiment.

FIGS. 15 and 16 shows the fourth and fifth embodiments of the present invention. These embodiments are different from that the embodiments in FIGS. 5 and 12. In each of the fourth and fifth embodiments, main row decoders (M•R/D) are arranged at both the ends of a cell array, and not only the design rules of the memory cell arrays and sub-row decoders, but also the design rule of main row decoder are relaxed.

In the fourth embodiment shown in FIG. 15, the design rule of main row decoders can be relaxed such that one main row decoder is arranged in an eight gate wiring width. In the fifth embodiment shown in FIG. 16, the design rule of main row decoders can be relaxed such that one main row decoder is arranged in a sixteen gate wiring width.

Embodiment 6

Figure 17:
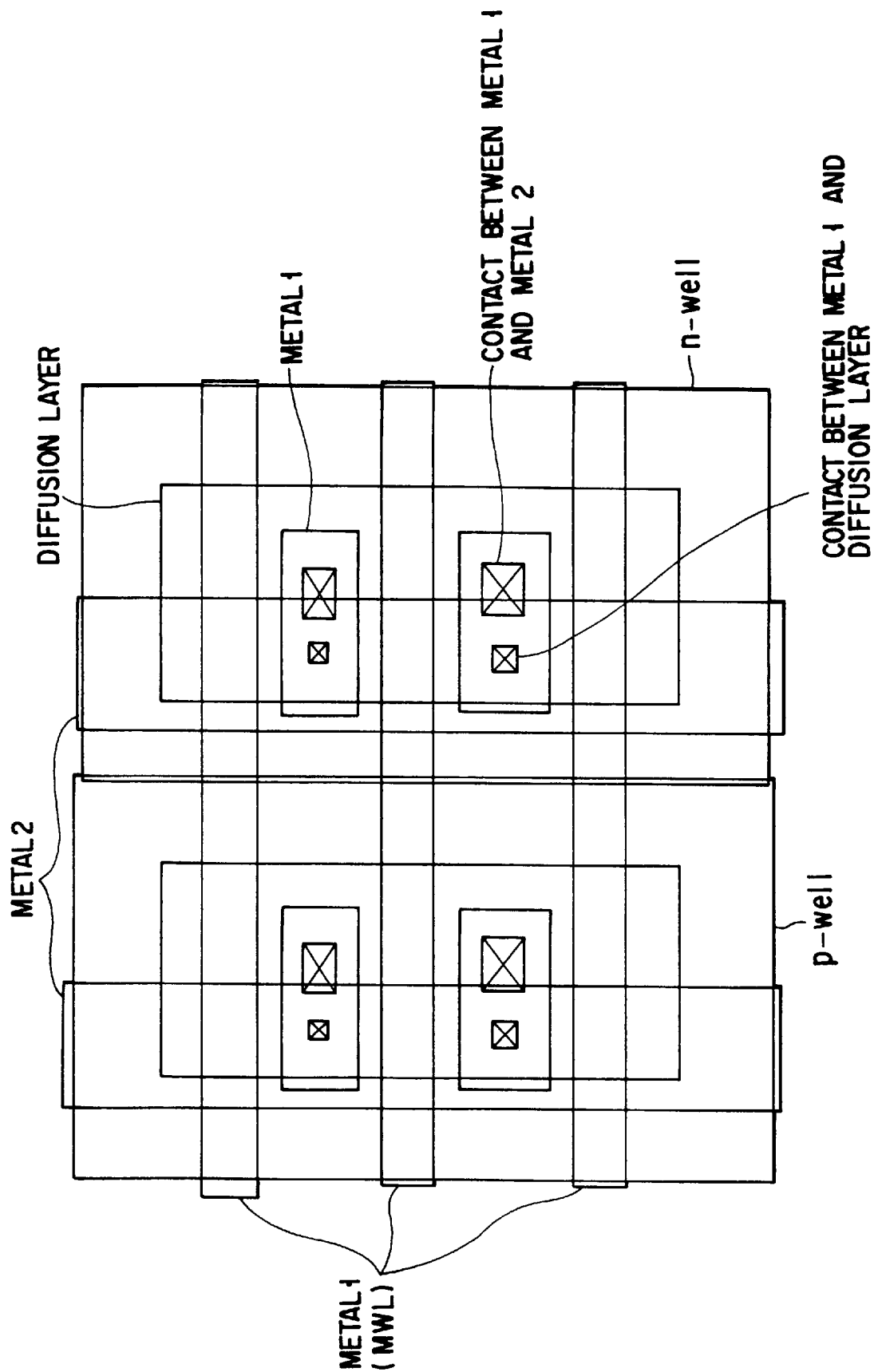
FIG. 17 is a view, for explaining the arrangement of a main part of a DRAM according to the sixth embodiment, showing the layout of a part of a sub-row decoder.

FIG. 17 is a view, for explaining the arrangement of a main part of a DRAM according to the sixth embodiment, showing the layout of a part of a sub-row decoder.

First layer metal wirings (metal 1) serving as main word lines (MWL) passes over a sub-row decoder. When the pitch of the first layer metal wirings in the sub-row decoder becomes severe by one, it is meaningless that the pitch of the first layer metal wirings is relaxed.

As shown in FIG. 17, for example, when a signal and a power supply from a bit line direction are supplied through second layer metal wirings (metal 2) to be connected to another diffusion layer, a transistor, or the like through the first layer metal wiring, the pitch of the first layer metal wirings of the sub-row decoder becomes severe because the signal and power supply is supplied through the first layer metal wiring. In particular, when the contact (VIA contact) between the metal 1 and the metal 2 is large, the pitch of the first layer metal wirings is severe. In this embodiment, the number of metals 1 is increased, the rule of the metals 1 is severer than the rule of cell arrays.

In this manner, the main word line wirings on the sub-row decoder and the main word line wirings on the subarray may be formed in the same metal layers, or may be formed in different metal layers in FIGS. 18A and 18B described as follows.

Embodiment 7

Figure 18A:
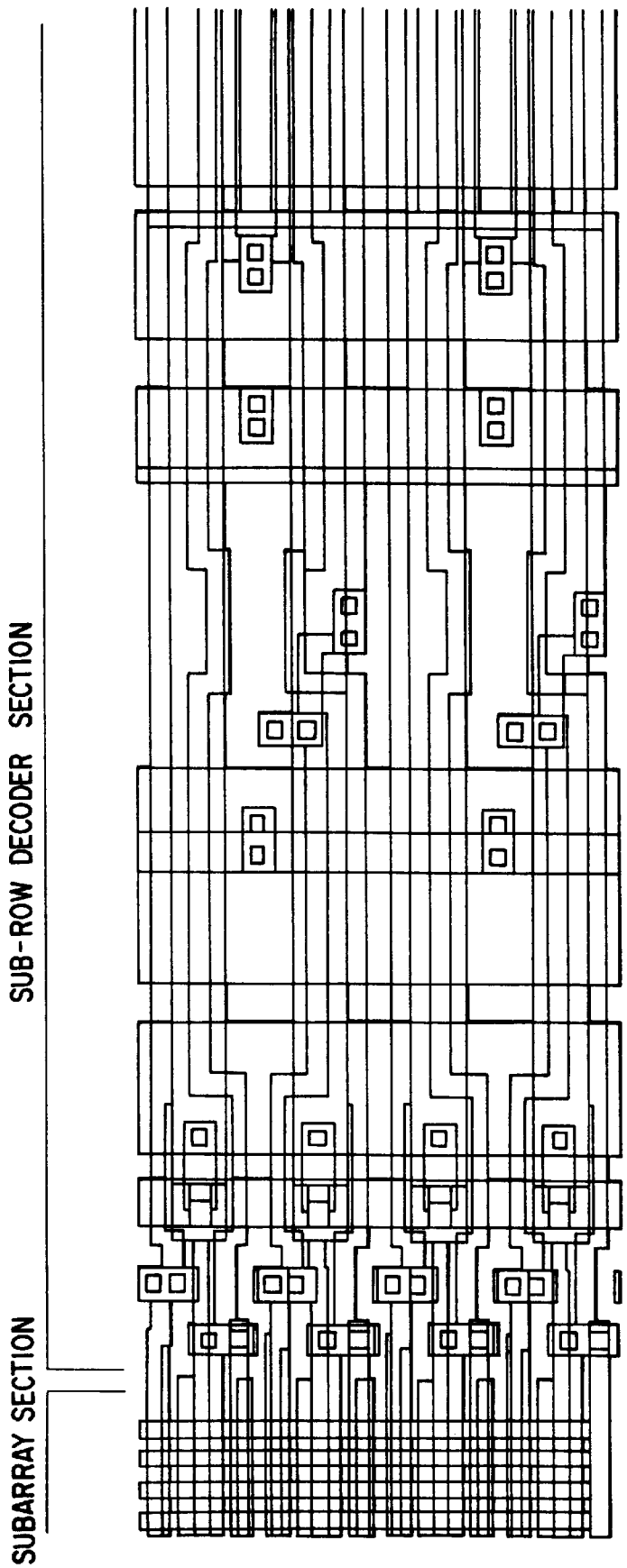
FIGS. 18A and 18B are views showing layouts of sub-row decoder sections in the seventh embodiment, respectively.
Figure 18B:
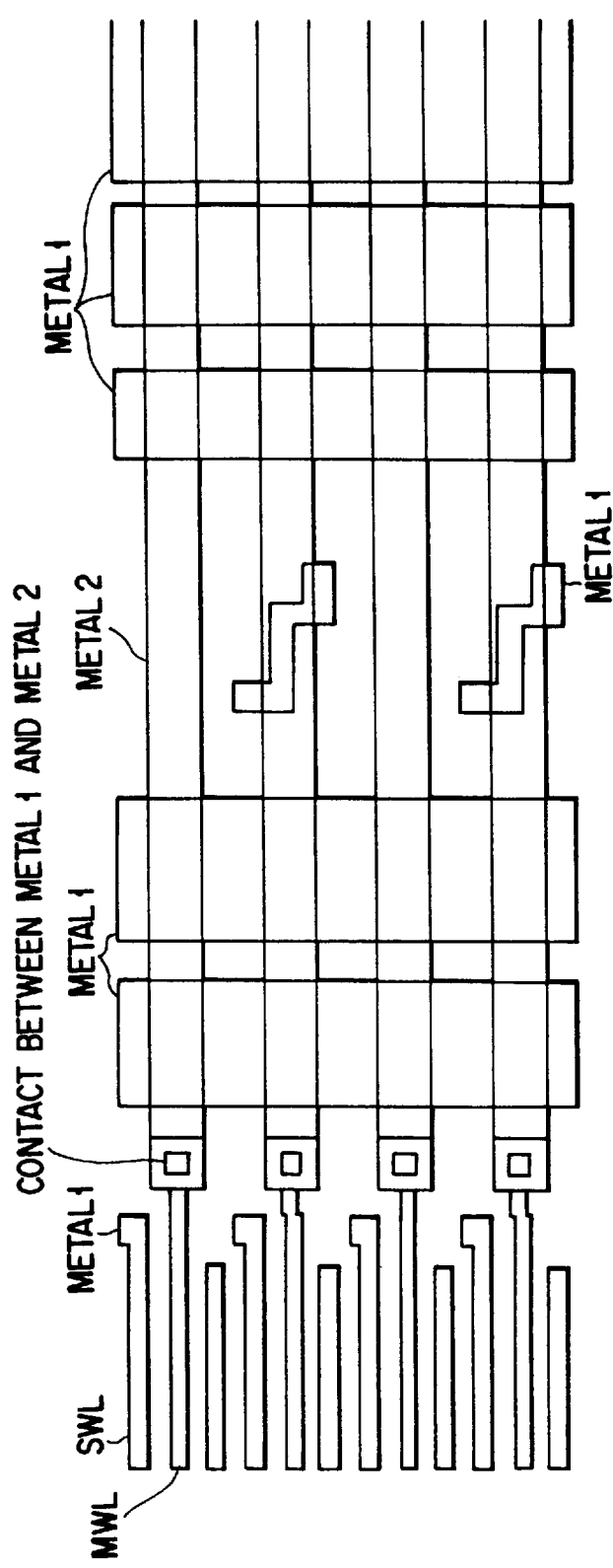

FIGS. 18A and 18B show the seventh embodiment of the present invention. FIG. 18B is obtained by extracting first layer metal wirings (metal 1), second layer metal wirings (metal 2), and contacts between the metals 1 and metals 2 from the arrangement in FIG. 18A.

As shown in FIG. 18B, a main word line (MWL) and a sub-word line (SWL) are connected to the same first layer metal wiring on a subarray, and the main word line is switched to the second layer metal wiring on the sub-row decoder. An address signal, a power supply, and the like from a bit line direction are connected to circuits through the first layer metal wirings.

In this manner, the address signal and the power supply need not be connected to the circuits through the second layer metal wirings and the first layer metal wirings, and are connected to the circuits through the first layer metal wirings. For this reason, a contact between the metal 1 and the metal 2 and a relay of the first layer metal wiring need not be arranged. Therefore, the rule of the first layer metal wirings can be relaxed.

Embodiment 8

Figure 19:
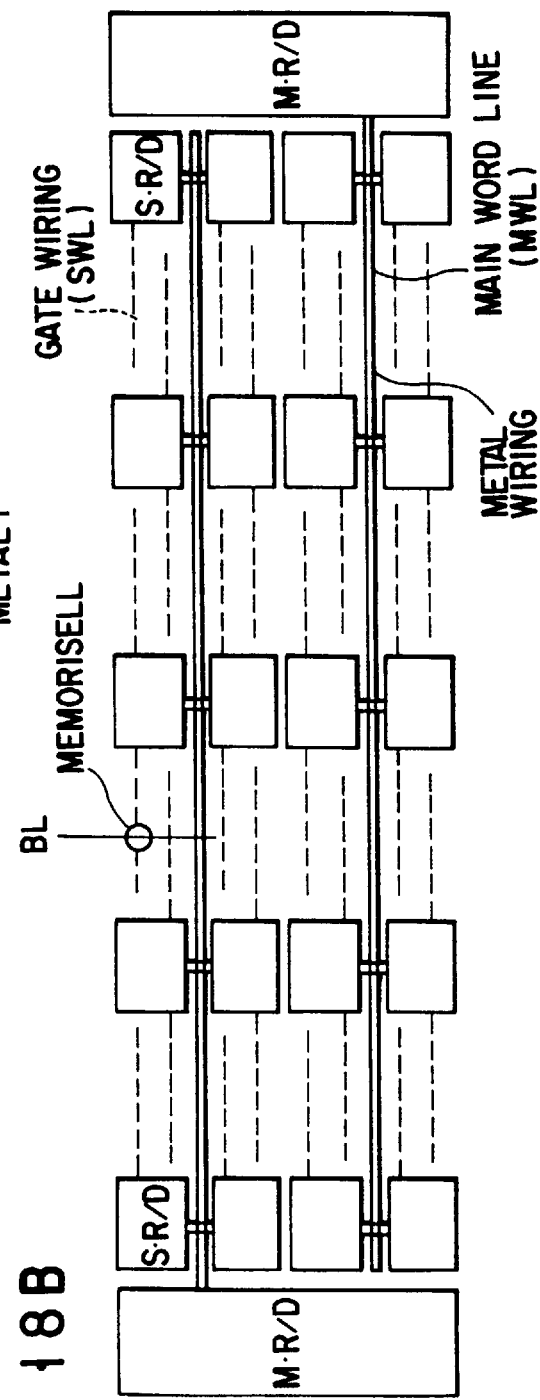
FIG. 19 is a view showing the arrangement connection relationship between a memory cell array section and a low decoder section in a DRAM according to the eighth embodiment.

FIG. 19 is a view showing the arrangement connection relationship between a memory cell array section and a low decoder section in a DRAM according to the eighth embodiment.

A memory cell array is divided by two or more (four in this embodiment) in a word line direction, and a sub-row decoder (S•R/D) is arranged as a subarray therebetween. This sub-row decoder performs decoding by an address from a main word line (MWL) and an address from a bit line direction, and enters the subarray as a sub-word line (SWL) through a gate wiring.

In this manner, since the sub-row decoder interval is divided into small intervals, the snap in the arrangement in FIG. 5 can be made unnecessary. In addition, due to the presence of the address in the bit line direction, the pitch of main word lines of the metal wirings in the word line direction can be considerably relaxed to be four times that of the prior art. Therefore, processing of the metal wirings on the sub-cell array becomes very easy. As is apparent form FIGS. 18A and 18B, one metal wiring is arranged for four gate wirings.

Figure 2A:
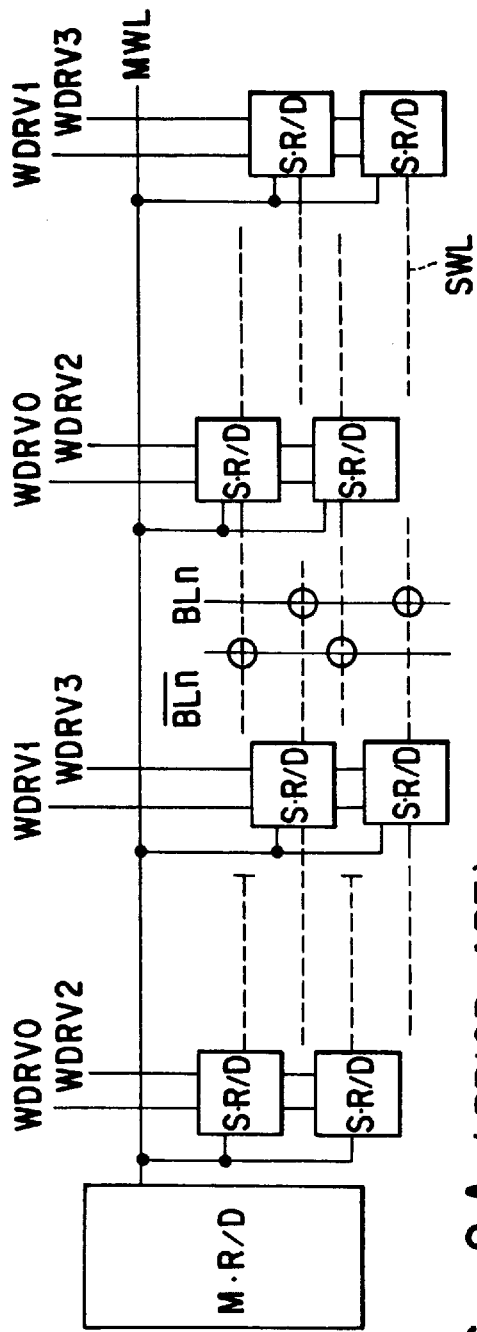
FIGS. 2A to 2C are views showing a hierarchy word line scheme in the conventional DRAM.
Figure 2B:
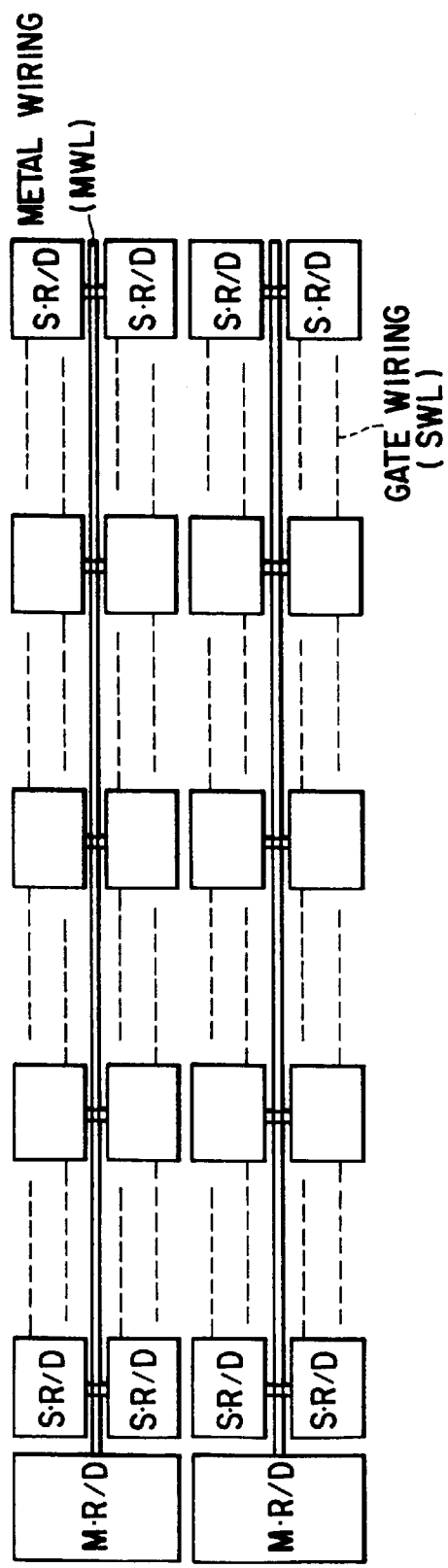
Figure 2C:
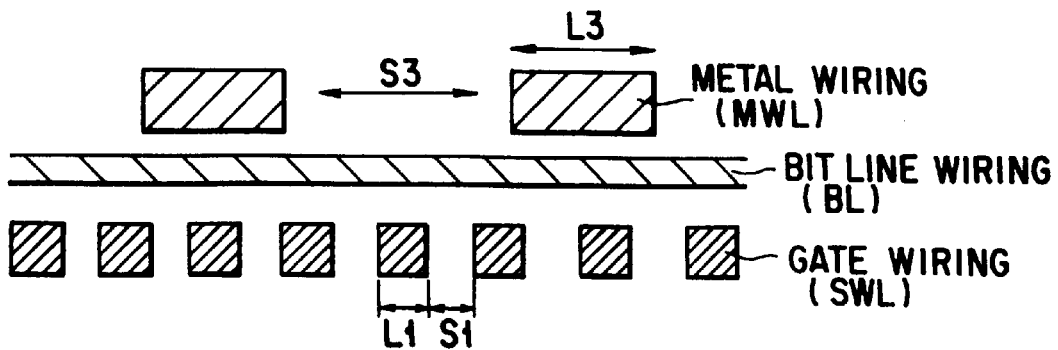
Figure 3:
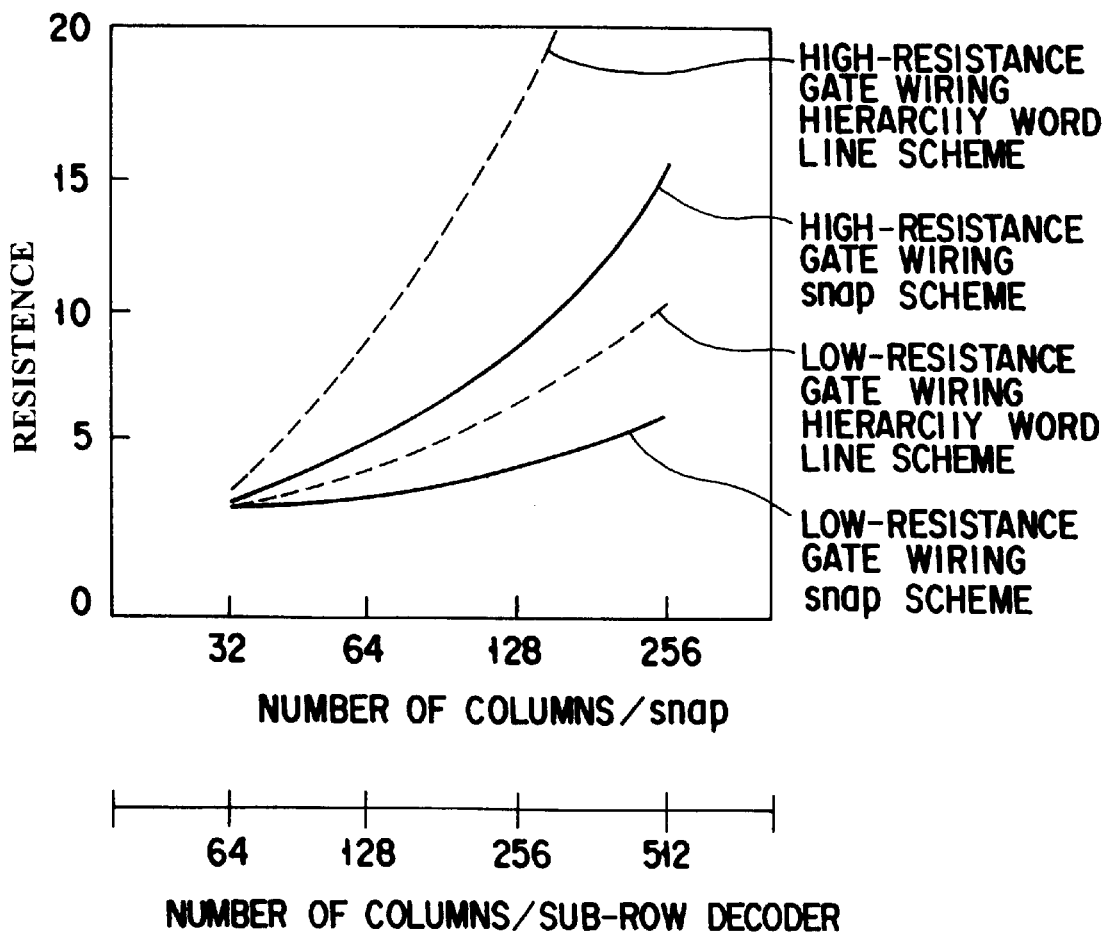
FIG. 3 is a graph for explaining a problem of the conventional DRAM.

Main row decoders for driving main word lines are arranged at both the ends of the memory cell array, and every other main word line of a plurality of main word lines is alternately connected to the main row decoders arranged at both the ends. For this reason, the pitch of metal wirings in the main row decoder can be apparently relaxed to be two times that in the conventional hierarchy word line scheme (FIG. 2B). Therefore, the problem that the pitch of metal wirings in the main row decoder is considerably severer than the pitch of the subarrays in the prior art is solved.

Figure 20:
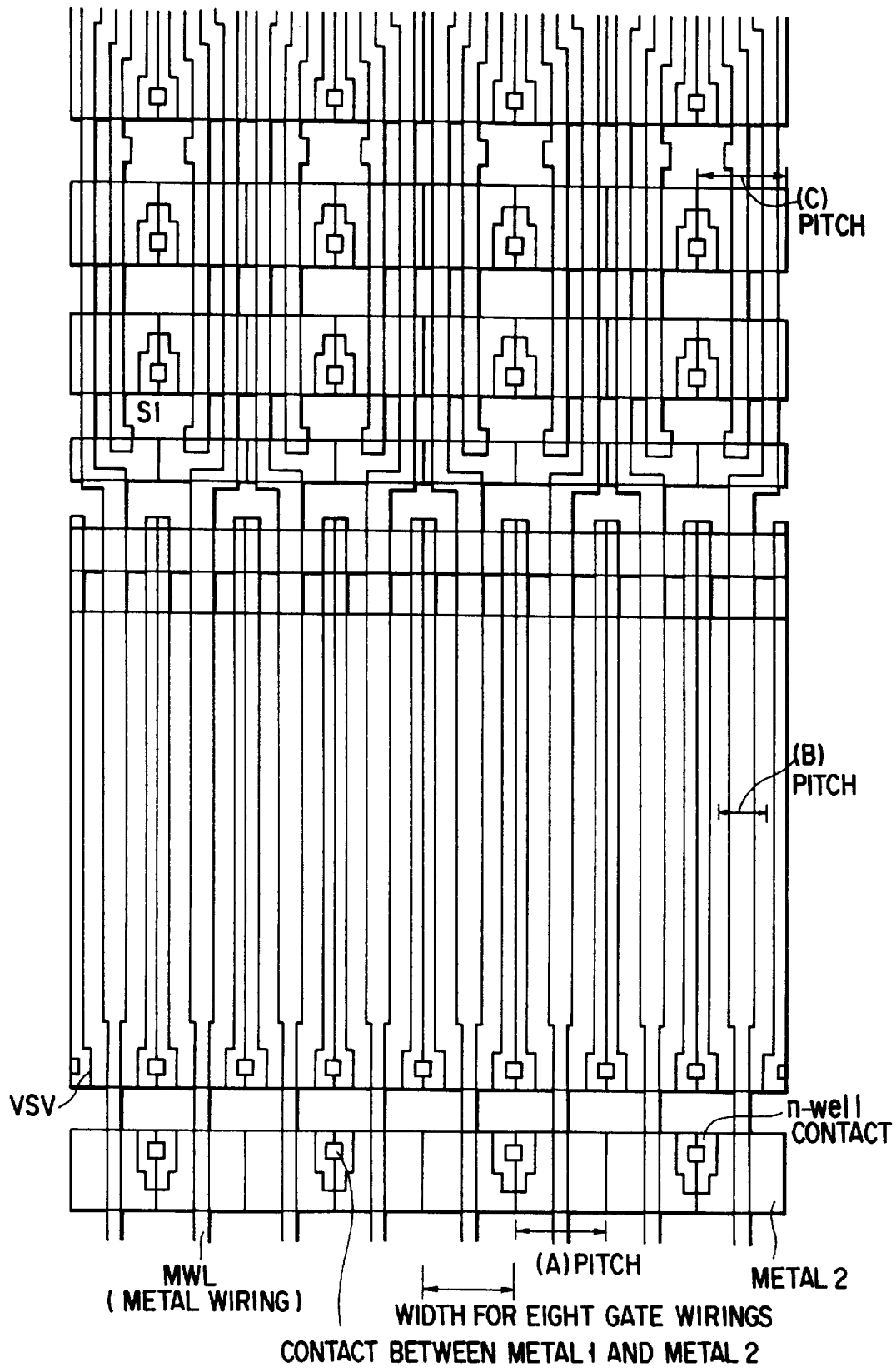
FIG. 20 is a view showing the layout of a main row decoder section in the eighth embodiment.

FIG. 20 is a view showing the layout of a main row decoder section in this embodiment. For the sake of descriptive convenience, FIG. 20 shows only metals 1, metals 2, and contact layers between the metals 1 and the metals 2. The pitch of the metals 1 of the main word lines are relaxed to be twice the pitch of metals 1 on a subarray because every other contact portion between a main row decoder and a sub-decoder is formed.

Even if the wirings of the metals 1 for a boosting power supply VSV in a transistor section (B) in which transistors Q1 are arranged are arranged, the pitch of the wirings is equal to the pitch of the metals 1 on the subarray. The pitch of drive transistors Q2 connected to the transistors Q1 is severer than that of subarrays (C portion) by 2/2.5 times, can be considerably relaxed compared with the pitch in the prior art. However, since the metal 1 of the (C) portion is not directly connected to a main word line, the metal is not related to the RC delay of the main word line, and the metal 1 need not be constituted by the metal 1.

FIGS. 21A and 21B show the layouts of sub-row decoder sections in this embodiment, respectively. Referring to FIG. 21A, the main word line passes through the sub-row decoder by the metal 1, and a signal (WDRV0) from a bit line direction is temporarily supplied from the metal 2 to the metal 1 and supplied to the lower layer of the metal 1. For this reason, the pitch of the metals 1 on the sub-row decoder becomes half the pitch of the metals 1 on the sub-array (M portion).

Figure 4:
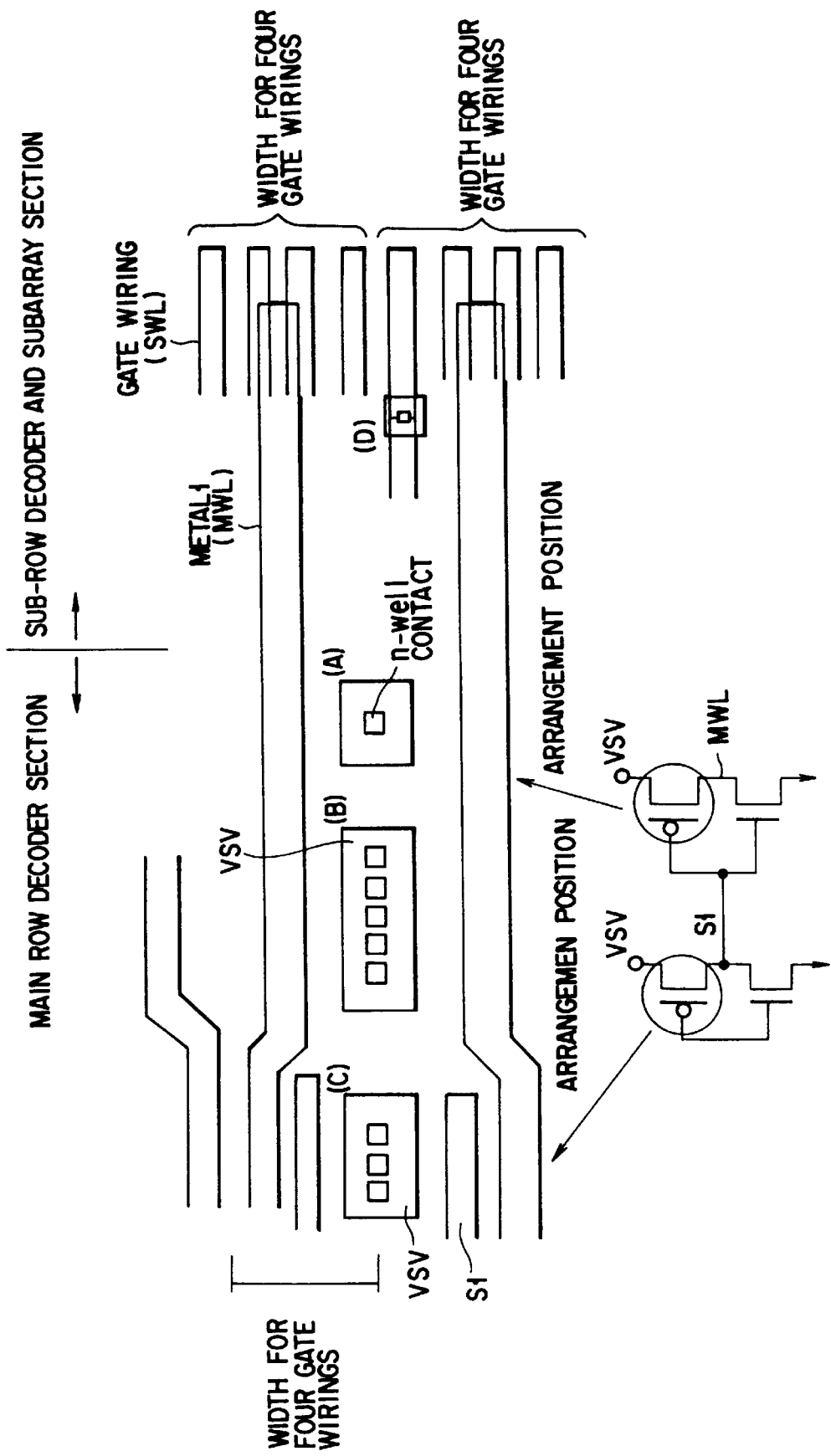
FIG. 4 is a view for explaining a problem of the conventional DRAM.

However, the sub-word lines of the gate wirings extend in the sub-row decoder by using the wirings identical to the bit lines, the rule of the sub-word line is more relax than that of the sub-word lines in the (D) portion in FIG. 4.

As shown in FIG. 21B, when the wiring of the metal 1 on the subarray is switched to the metal 2, a portion such as an (M) portion in FIG. 21A can be omitted. This is because, since a signal from the bit line direction is switched to the metal 1 and directly supplied to the lower layer, the wiring can be performed regardless of the metal 2 on the upper layer of the metal 1. In addition, the sub-word line extends in the sub-row decoder by a bit line wiring. As a result, the pitch of the metals 1 on the subarray can be made equal to that on the sub-row decoder.

Embodiment 9

Figure 22:
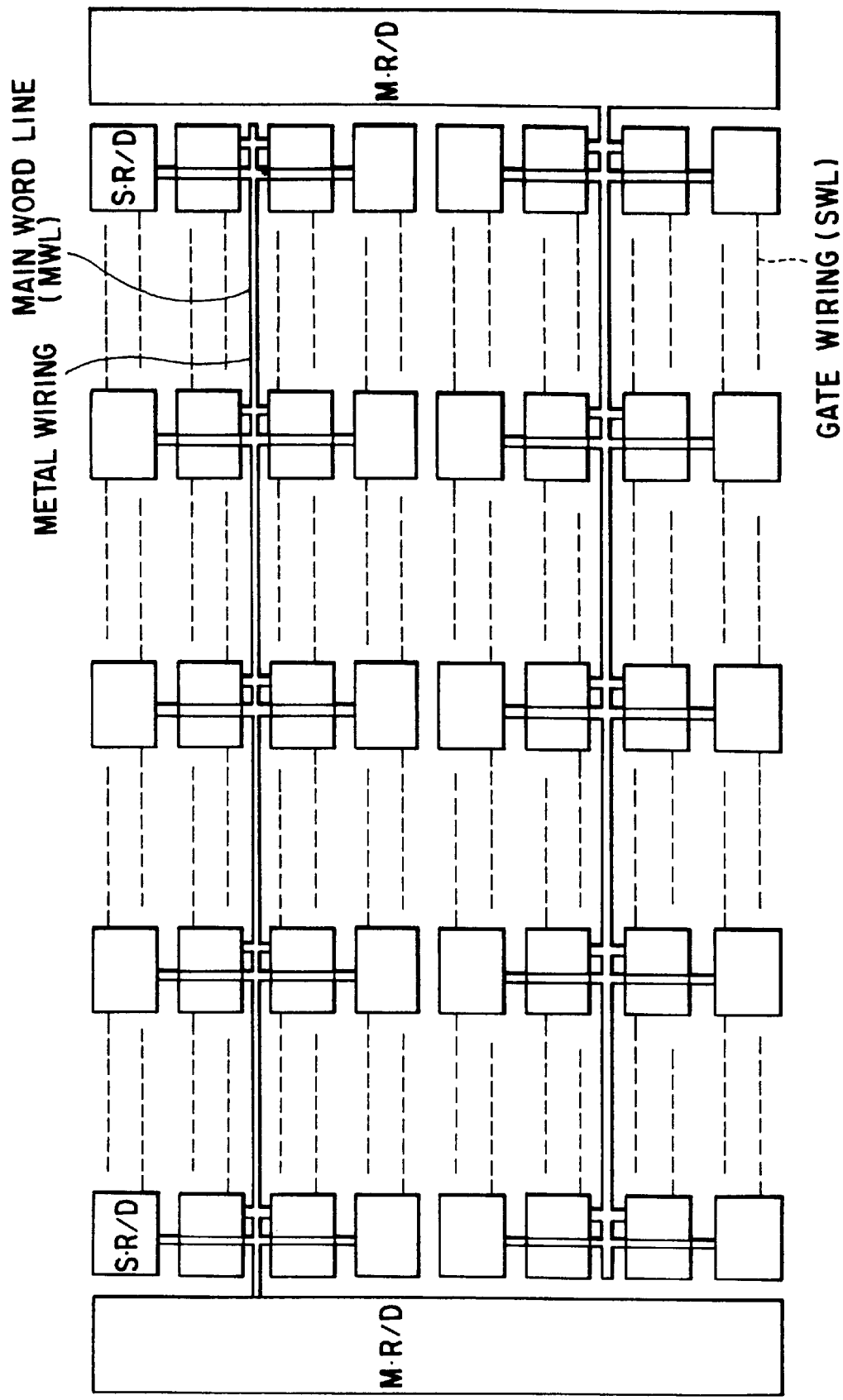
FIG. 22 is a view showing the arrangement connection relationship between a memory cell array section and a low decoder section in a DRAM according to the ninth embodiment.

FIG. 22 is a view showing the arrangement connection relationship between a memory cell array section and a low decoder section in a DRAM according to the ninth embodiment.

According to this embodiment, the number of addresses from a bit line direction supplied to a sub-row decoder (S•R/D) is increased, and the pitch of main word lines (MWL) is eight times the pitch of sub-word lines (SWL). At this time, when main row decoders (M•R/D) are arranged at both the ends of an array, the pitch of metals 1 of the main row decoder can be made twice that in FIG. 19.

Embodiment 10

In the first embodiment, a contact from a metal wiring layer consisting of Al to a gate wiring consisting of polysilicon must be formed at a portion where gate wirings are arranged at the minimum pitch. In this case, when the minimum processing dimension is represented by F, the intervals of word lines and the width of each word line are F, and the size of the contact is F×F square. For this reason, the gate wiring cannot be sufficiently large with respect to the position of the contact. At this time, in processing the gate wiring and the contact, when the relative positions of the masks of the gate wiring and contact are shifted from a substrate, the contact is formed outside the gate. For this reason, the gate wiring and the substrate are disadvantageously short-circuited.

Although a contact hole is formed by RIE, processes having different etch rates are generally applied to an interlayer and a gate material. More specifically, when $SiO_2$ and polysilicon are used as the interlayer and the gate materials, respectively, an RIE process having an etch rate for polysilicon and an etch rate for $SiO_2$ is used. However, when the contact is arranged to be shifted from the gate wiring, a hole to be stopped at the gate material extends to the substrate. For this reason, a potential to be applied to the gate is applied to the substrate, and the gate and substrate are short-circuited.

This embodiment is to solve the problem that a processing margin of the contact to the gate cannot be formed in a scheme in which the pitch of metal wirings can be more relax than that in the conventional snap scheme without increasing a chip area or increasing the RC delay of a word line as in the first embodiment.

FIG. 23A and 23B are views showing a drive circuit of word lines, a gate wiring, the wiring of a layer above a gate according to the tenth embodiment. FIGS. 24A to 24D are views showing layouts of this embodiment and shows boundary portions between sub-subarrays. FIG. 24A shows all of the gate wiring, a bit line wiring, and a metal wiring, FIG. 24B whose the gate wiring and bit line wiring, FIG. 24C shows a bit line wiring and a metal wiring, and FIG. 24D shows only the gate wiring.

In this embodiment, three aluminum wirings are arranged for four gates, and the processing pitch of the metal wiring layers is relaxed. The wiring layer of the bit lines is processed at an intermediate pitch between the pitch of an aluminum wiring layer and the pitch of a gate wiring layer. At this portion, the aluminum wiring layer is connected to the gate wiring layer through a bit line wiring. As the processing pitch of the bit lines at this portion, only a maximum of two bit line wirings are arranged for four gates in this embodiment, and a processing dimension which is made sufficiently relax compared with the processing dimension of the gate wiring layer can be realized.

The basic arrangement up to this is the same as that of the first embodiment. This embodiment has, in addition to this basic arrangement, a characteristic feature that one of each two gate wirings is cut. More specifically, one of each two word lines is cut at the boundary portion between sub-subarrays obtained by each subarray is divided by two in a word line direction, each word line whose gate wiring is not cut is brought into contact with an upper metal wiring layer at the boundary portion between the sub-subarrays. Each word line whose gate wiring is cut and which is close to a sub-row decoder for driving the corresponding word line is brought into contact with metal wiring layer at the boundary portion between the sub-row decoder and the subarray, and each word line which is away from the sub-row decoder is brought into contact with the metal wiring layer at the boundary portion between the sub-subarrays.

In the layout of gate wirings and the contacts between gates and bit lines, as shown in FIG. 24D, a sufficiently large margin of the gate can be obtained around the contact. More specifically, when the width of each gate wiring and the interval between gate wirings are set to be a minimum processing dimension F, and the contact is formed to have a size of F×F, the gate wirings can be arranged around the contact with a margin having a width of F.

In this manner, even if the relative positions of the gate wiring and the contact are shifted from each other by a maximum of F in processing, a contact to the gate can be prevented from extending to the substrate at a portion outside the gate. This is realized such that one of each two word lines is cut every sub-subarray, and the contact between the bit line and the gate is formed at the cut portion.

Cut word lines WLB1 and WLB2 are electrically connected to each other above and below the boundary portion of two sub-subarrays. This can be realized by the following arrangement. That is, as shown in FIG. 25, a contact to a gate belonging to a sub-subarray 1 is formed by an aluminum wiring layer at the boundary portion between the sub-row decoder and the sub-subarray, and a contact to a gate belonging to a sub-subarray 2 is formed through a bit line wiring layer at the boundary portion between the sub-subarrays 1 and 2. The arrangement in which an aluminum wiring and a gate wiring are connected to each other through a bit line is as shown in FIG. 7C.

In this case, one reason why the aluminum wiring is connected to the gate wiring through the bit line at the boundary portion between sub-subarrays is as follows. That is, in order to form the direct contact from the aluminum wiring layer to the gate, a contact hole having a very large depth, i.e., a high aspect ratio must be formed. Since it is technically difficult to form this contact hole, the step of forming the contact is made easy such that the aluminum wiring is connected to the gate wiring through the bit line.

Another reason is as follows. That is, as shown in FIG. 26, a wiring to a gate on an away side (sub-subarray 2) from a first sub-row decoder for driving the word line WLB1 and a wiring to a gate belonging to a first sub-subarray from a second sub-row decoder for driving the word line WLB2 must cross each other. When these wirings are tried to cross each other through the metal wiring, the processing pitch of aluminum must be decreased. For this reason, these wirings cross each other by using the bit line wiring layer.

As described above, according to this embodiment, the same effect as that of the first embodiment can be obtained as a matter of course. At a contact portion from the upper layer wiring to the gate, only contacts to two gates need be formed at a pitch of four word lines, the margin of the gate material with respect to the contact can be increased to the width of the gate material and the interval of the gate materials.

Embodiment 11

Figure 27A:
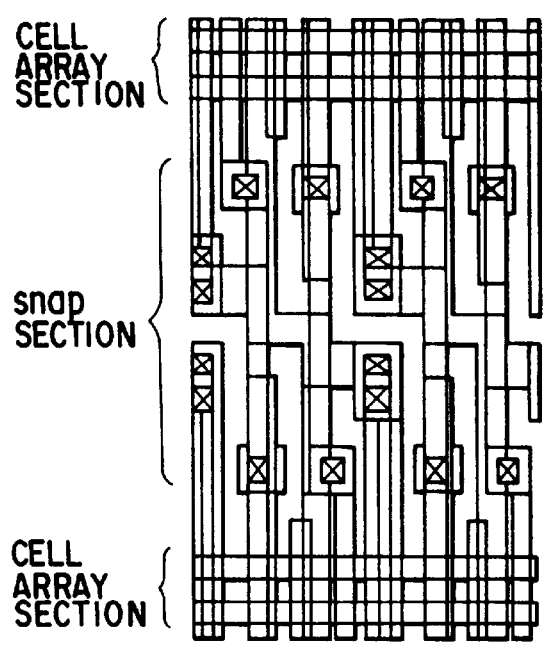
FIGS. 27A to 27D are views showing the layouts of boundary portions between sub-subarrays in the eleventh embodiment, respectively.
Figure 27B:
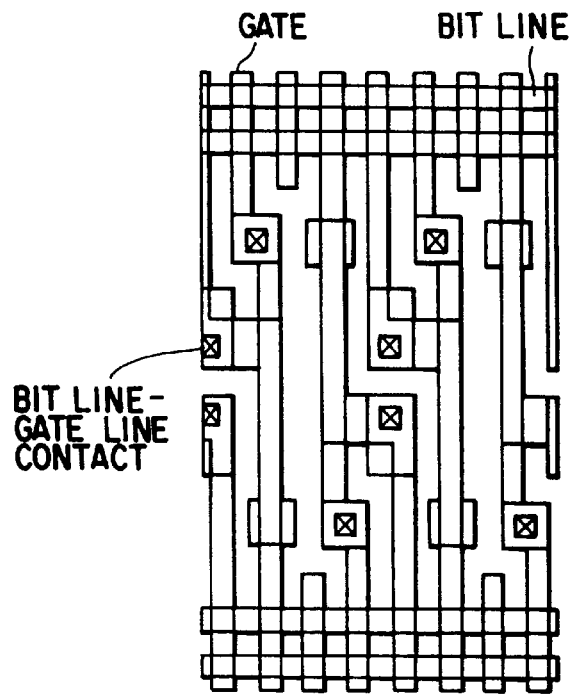
Figure 27C:
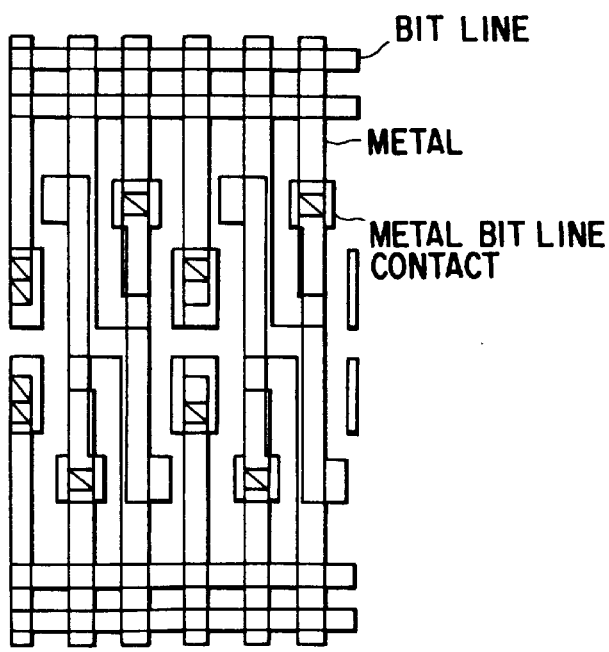
Figure 27D:
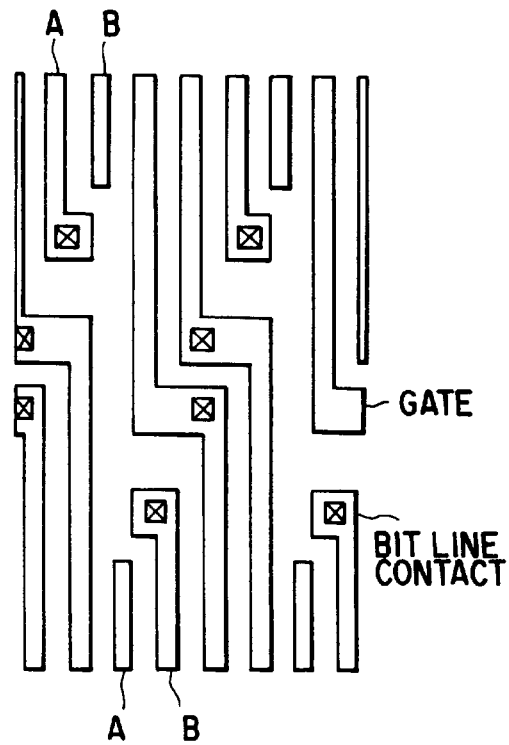

FIGS. 27A to 27D are views showing layouts according to the eleventh embodiment of the present invention. FIG. 27A shows all of a gate wiring, a bit line wiring, and a metal wiring, FIG. 27B shows the gate wiring and the bit line wiring, FIG. 27C shows the bit line wiring and a metal wiring, and FIG. 27D shows only the gate wiring.

In the tenth embodiment, word lines which are electrically equivalent to each other are arranged on the same straight line in each of two sub-subarrays. The eleventh embodiment describes the arrangement in which word lines are not arranged on the same straight line in each sub-subarray. In this arrangement, the same effect as that in the tenth embodiment can be obtained.

The present invention is not limited to each of the above embodiments, and various changes and modifications can be effected without departing from the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a plurality of word lines constituted by gate wirings;

a plurality of bit lines arranged perpendicular to said plurality of word lines;

a memory cell array having memory cells selectively arranged at intersections of said plurality of word lines and said plurality of bit lines, said memory cell array having a plurality of subarrays which are arranged in a word line direction;

a main row decoder arranged at least at one end of said memory cell array in the word line direction;

a plurality of sub-row decoders arranged at least at one end of each of said plurality of subarrays; and a first wiring layer including a plurality of first wirings formed above said gate wirings and each one of said plurality of first wirings is extended from said sub-row decoder neighboring to one of said plurality of subarrays to a center of said one of said plurality of subarrays, and is connected to each of said gate wirings in said one of said plurality of subarrays.

2. A semiconductor memory device according to claim 1, wherein said plurality of main row decoder and said sub-row decoders are connected to each other by using the same wiring layer as said first wiring layer.

3. A semiconductor memory device according to claim 2, wherein said main row decoder and said plurality of sub-row decoders are connected by the same wiring layer as said first wiring layer on said subarrays, and are connected to each other buy a wiring layer different from said first wiring layer on said plurality of sub-row decoders.

4. A semiconductor memory device according to claim 1, wherein said first wiring layer is made of a wiring including aluminum or copper as main component.

5. A semiconductor memory device according to claim 1, wherein said gate wiring is a wiring containing one of polysilicon, tungsten-silicide, molybdenum-silicide, molybdenum and titanium-silicide.

6. A semiconductor memory device according to claim 1, wherein said main row decoder is arranged at each of both ends of said memory cell array in the word line direction.

7. A semiconductor memory device according to claim 2, wherein said first wiring layer includes three first wirings, and said three first wirings are arranged in an area in which four said gate wirings are arranged.

8. A semiconductor memory device according to claim 7, wherein said first wiring layer includes a main gate wiring from said main row decoder and a plurality of subgate wirings from said sub-row decoders.

9. A semiconductor memory device according to claim 2, wherein said first wiring layer includes five first wirings, and said five first wirings are arranged in an area in which eight said gate wirings are arranged.

10. A semiconductor memory device according to claim 9, wherein said first wiring layers includes a main gate wiring from said main row decoder and a plurality of subgate wirings from said sub-row decoders.

11. A semiconductor memory device according to claim 2, wherein said sub-row decoder includes one drive circuit arranged for two word lines.

12. A semiconductor memory device according to claim 1, wherein a contact from said first wiring layer to said gate wiring is formed through a third wiring layer.

13. A semiconductor memory device according to claim 1, wherein said plurality of sub-row decoders are added at a first end and a second end of said subarray, one of said plurality of first wirings extended from said plurality of sub-row decoder arranged at the first end of said subarrays and another said plurality of first wirings extended from said plurality of sub-row decoder arranged at the second end of said subarrays are connected to the centers of said plurality of subarrays and are substantially arranged on a straight line in the word line direction to be electrically insulated from each other not to overlap.

14. A semiconductor memory device according to claim 13, wherein a contact from said first wiring layer to said gate wiring is formed through a third wiring layer.

15. A semiconductor memory device according to claim 13, wherein said main row decoder and said sub-row decoder are connected to each other by using the same wiring layer as said first wiring layer.

16. A semiconductor memory device according to claim 15, wherein said main row decoder and said sub-row decoder are connected by the same wiring layer as said first wiring layer on said subarray, and are connected to each other by a wiring layer different from said first wiring layer on said sub-row decoder.

17. A semiconductor memory device according to claim 13, wherein said first wiring layer is made of a wiring including aluminum or copper as main component.

18. A semiconductor memory device according to claim 15, wherein said gate wiring is a wiring containing one of polysilicon, tungsten-silicide, tungsten, molybdenum-silicide, molybdenum and titanium-silicide.

19. A semiconductor memory device according to claim 13, wherein said main row decoder is arranged at each of both ends of said memory cell array in the word line direction.

20. A semiconductor memory device according to claim 15, wherein said first wiring layer includes three first wirings, and said three first wirings are arranged in an area in which four said gate wirings are arranged.

21. A semiconductor memory device according to claim 13, wherein said first wiring layer includes five first wirings, and said five first wirings are arranged in an area in which eight said gate wirings are arranged.

22. A semiconductor memory device according to claim 13, wherein said sub-row decoder includes one drive circuit arranged for two word lines.

23. A semiconductor memory device according to claim 13, wherein a contact from said first wiring layer to said gate wiring is formed through a third wiring layer.

24. A semiconductor memory device according to claim 1, wherein said plurality of subarrays include two sub-subarrays arranged to the word lines direction, and one of each two gate wirings of said plurality of subarray is cut at a boundary portion between said two sub-subarrays.

25. A semiconductor memory device according to claim 24, wherein a word line of each of said plurality of subarrays having a gate wiring which is not cut is brought into contact with said first wiring layer at the boundary between said two sub-subarrays, a word line of said word lines from said subarray having a gate wiring which is cut, a word line which is close to said sub-row decoder for driving the corresponding word line is brought into contact with said first wiring layer at a boundary portion between said sub-row decoder and said subarray, and a word line of said word lines from said subarray having a gate wiring which is cut, a word line which is apart from said sub-row decoder for driving the corresponding word line is brought into contact with said first wiring layer at a boundary portion between said sub-subarrays.

26. A semiconductor memory device according to claim 24, wherein said main row decoder and said sub-row decoder are connected by the same wiring layer as said first wiring layer on said subarray, and are connected to each other by a wiring layer different from said first wiring layer on said sub-row decoder.

27. A semiconductor memory device according to claim 24, wherein said first wiring layer is made of a wiring including aluminum or copper as main component.

28. A semiconductor memory device according to claim 24, wherein said gate wiring is a wiring containing one of polysilicon, tungsten-silicide, tungsten, molybdenum-silicide, molybdenum and titanium-silicide.

29. A semiconductor memory device according to claim 24, wherein said main row decoder is arranged at each of the ends of said memory cell array in the word line direction.

30. A semiconductor memory device according to claim 24, wherein said first wiring layer includes three first wirings, and said three first wirings are arranged in an area in which four said gate wirings are arranged.

31. A semiconductor memory device according to claim 24, wherein said first wiring layer includes first five wirings, and said five first wirings are arranged in an area in which eight said gate wirings are arranged.

32. A semiconductor memory device according to claim 24, wherein said sub-row decoder includes one drive circuit arranged for two word lines.

33. A semiconductor memory device according to claim 24, wherein a contact from said first wiring layer to said gate wiring is formed through a third wiring layer.

* * * * *